United States Patent
Belesiu et al.

(10) Patent No.: US 9,047,207 B2
(45) Date of Patent: Jun. 2, 2015

(54) MOBILE DEVICE POWER STATE

(71) Applicant: Microsoft Corporation, Redmond, WA (US)

(72) Inventors: Jim Tom Belesiu, Mill Creek, WA (US); Sharon Drasnin, Seattle, WA (US); Michael A. Schwager, Seattle, WA (US); Christopher Harry Stoumbos, Sammamish, WA (US); Mark J. Seilstad, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 13/651,976

(22) Filed: Oct. 15, 2012

(65) Prior Publication Data
US 2013/0229568 A1 Sep. 5, 2013

Related U.S. Application Data

(63) Continuation of application No. 13/471,001, filed on May 14, 2012, now abandoned.

(60) Provisional application No. 61/606,321, filed on Mar. 2, 2012, provisional application No. 61/606,301, filed on
(Continued)

(51) Int. Cl.
*G06F 1/26* (2006.01)
*G06F 1/32* (2006.01)
(Continued)

(52) U.S. Cl.
CPC .......... *G06F 13/102* (2013.01); *G06F 3/0202* (2013.01); *G06F 1/1684* (2013.01);
(Continued)

(58) Field of Classification Search
None
See application file for complete search history.

(56) References Cited

U.S. PATENT DOCUMENTS

| 578,325 A | 3/1897 | Fleming |
| 3,600,528 A | 8/1971 | Leposavic |

(Continued)

FOREIGN PATENT DOCUMENTS

| CA | 990023 | 6/1976 |
| CN | 103455149 | 12/2013 |

(Continued)

OTHER PUBLICATIONS

"Accessing Device Sensors", retrieved from <https://developer.palm.com/content/api/dev-guide/pdk/accessing-device-sensors.html> on May 25, 2012, 4 pages.

(Continued)

*Primary Examiner* — Kim Huynh
*Assistant Examiner* — Vincent Chang
(74) *Attorney, Agent, or Firm* — Ladislav Kusnyer; Judy Yee; Micky Minhas

(57) ABSTRACT

Techniques for mobile device power state are described. In one or more implementations, a mobile device includes a computing device that is flexibly coupled to an input device via a flexible hinge. Accordingly, the mobile device can operate in a variety of different power states based on a positional orientation of the computing device to an associated input device. In one or more implementations, an application that resides on a computing device can operate in different application states based on a positional orientation of the computing device to an associated input device. In one or more implementations, techniques discussed herein can differentiate between vibrations caused by touch input to a touch functionality, and other types of vibrations. Based on this differentiation, techniques can determine whether to transition between device power states.

20 Claims, 10 Drawing Sheets

Related U.S. Application Data on Mar. 2, 2012, provisional application No. 61/606,313, filed on Mar. 2, 2012, provisional application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012.

(51) Int. Cl.

| | |
|---|---|
| *G06F 13/10* | (2006.01) |
| *G06F 3/02* | (2006.01) |
| *G06F 1/16* | (2006.01) |
| *H05K 5/02* | (2006.01) |
| *H04M 1/02* | (2006.01) |
| *H04M 1/725* | (2006.01) |
| *G05B 11/01* | (2006.01) |
| *G06F 3/041* | (2006.01) |
| *H01H 13/704* | (2006.01) |
| *H01H 13/82* | (2006.01) |
| *G06F 3/00* | (2006.01) |
| *G06F 3/01* | (2006.01) |
| *H01H 13/702* | (2006.01) |
| *H01H 13/14* | (2006.01) |
| *H01H 13/703* | (2006.01) |
| *G06F 9/54* | (2006.01) |
| *G06F 11/30* | (2006.01) |

(52) U.S. Cl.
CPC ............ *H05K5/0226* (2013.01); *H05K 5/0234* (2013.01); *G06F 1/1618* (2013.01); *G06F 1/1654* (2013.01); *G06F 1/1669* (2013.01); *G06F 1/1681* (2013.01); *G06F 1/1683* (2013.01); *H04M 1/0216* (2013.01); *H04M 1/0245* (2013.01); *H04M 1/0254* (2013.01); *H04M 1/72527* (2013.01); *G05B 11/01* (2013.01); *G06F 3/0416* (2013.01); *H01H 13/704* (2013.01); *H01H 13/82* (2013.01); *G06F 3/0414* (2013.01); *G06F 3/002* (2013.01); *G06F 3/01* (2013.01); *H01H 13/702* (2013.01); *H01H 13/14* (2013.01); *H01H 13/703* (2013.01); *H01H 2201/036* (2013.01); *H01H 2205/006* (2013.01); *H01H 2211/006* (2013.01); *G06F 1/1656* (2013.01); *G06F 9/541* (2013.01); *G06F 11/3089* (2013.01)

(56) References Cited

U.S. PATENT DOCUMENTS

| | | | |
|---|---|---|---|
| 3,777,082 A | 12/1973 | Hatley |
| 3,879,586 A | 4/1975 | DuRocher et al. |
| 4,046,975 A | 9/1977 | Seeger, Jr. |
| 4,065,649 A | 12/1977 | Carter et al. |
| 4,086,451 A | 4/1978 | Boulanger |
| 4,243,861 A | 1/1981 | Strandwitz |
| 4,302,648 A | 11/1981 | Sado et al. |
| 4,317,013 A | 2/1982 | Larson |
| 4,365,130 A | 12/1982 | Christensen |
| 4,492,829 A | 1/1985 | Rodrique |
| 4,503,294 A | 3/1985 | Matsumaru |
| 4,527,021 A | 7/1985 | Morikawa et al. |
| 4,559,426 A | 12/1985 | Van Zeeland et al. |
| 4,577,822 A | 3/1986 | Wilkerson |
| 4,588,187 A | 5/1986 | Dell |
| 4,607,147 A | 8/1986 | Ono et al. |
| 4,651,133 A | 3/1987 | Ganesan et al. |
| 4,735,394 A | 4/1988 | Facco |
| 5,008,497 A | 4/1991 | Asher |
| 5,021,638 A | 6/1991 | Nopper et al. |
| 5,107,401 A | 4/1992 | Youn |
| 5,128,829 A | 7/1992 | Loew |
| 5,220,521 A | 6/1993 | Kikinis |
| 5,235,495 A | 8/1993 | Blair et al. |
| 5,283,559 A | 2/1994 | Kalendra et al. |
| 5,331,443 A | 7/1994 | Stanisci |
| 5,363,075 A | 11/1994 | Fanucchi |
| 5,375,076 A | 12/1994 | Goodrich et al. |
| 5,404,133 A | 4/1995 | Moriike et al. |
| 5,480,118 A | 1/1996 | Cross |
| 5,491,313 A | 2/1996 | Bartley et al. |
| 5,546,271 A | 8/1996 | Gut et al. |
| 5,548,477 A | 8/1996 | Kumar et al. |
| 5,558,577 A | 9/1996 | Kato |
| 5,618,232 A | 4/1997 | Martin |
| 5,661,279 A | 8/1997 | Kenmochi |
| 5,666,112 A | 9/1997 | Crowley et al. |
| 5,681,220 A | 10/1997 | Bertram et al. |
| 5,737,183 A | 4/1998 | Kobayashi et al. |
| 5,745,376 A | 4/1998 | Barker et al. |
| 5,748,114 A | 5/1998 | Koehn |
| 5,781,406 A | 7/1998 | Hunte |
| 5,807,175 A | 9/1998 | Davis et al. |
| 5,818,361 A | 10/1998 | Acevedo |
| 5,828,770 A | 10/1998 | Leis et al. |
| 5,842,027 A | 11/1998 | Oprescu et al. |
| 5,874,697 A | 2/1999 | Selker et al. |
| 5,905,485 A | 5/1999 | Podoloff |
| 5,924,555 A | 7/1999 | Sadamori et al. |
| 5,926,170 A | 7/1999 | Oba |
| 5,971,635 A | 10/1999 | Wise |
| 6,002,389 A | 12/1999 | Kasser |
| 6,002,581 A | 12/1999 | Lindsey |
| 6,005,209 A | 12/1999 | Burleson et al. |
| 6,012,714 A | 1/2000 | Worley et al. |
| 6,040,823 A | 3/2000 | Seffernick et al. |
| 6,042,075 A | 3/2000 | Burch, Jr. |
| 6,044,717 A | 4/2000 | Biegelsen et al. |
| 6,061,644 A | 5/2000 | Leis |
| 6,108,200 A | 8/2000 | Fullerton |
| 6,112,797 A | 9/2000 | Colson et al. |
| 6,128,007 A | 10/2000 | Seybold |
| 6,141,388 A | 10/2000 | Servais et al. |
| 6,178,085 B1 | 1/2001 | Leung |
| 6,178,443 B1 | 1/2001 | Lin |
| 6,188,391 B1 | 2/2001 | Seely et al. |
| 6,234,820 B1 | 5/2001 | Perino et al. |
| 6,254,105 B1 | 7/2001 | Rinde et al. |
| 6,279,060 B1 | 8/2001 | Luke et al. |
| 6,329,617 B1 | 12/2001 | Burgess |
| 6,344,791 B1 | 2/2002 | Armstrong |
| 6,366,440 B1 | 4/2002 | Kung |
| 6,380,497 B1 | 4/2002 | Hashimoto et al. |
| 6,437,682 B1 | 8/2002 | Vance |
| 6,450,046 B1 | 9/2002 | Maeda |
| 6,506,983 B1 | 1/2003 | Babb et al. |
| 6,511,378 B1 | 1/2003 | Bhatt et al. |
| 6,532,147 B1 | 3/2003 | Christ, Jr. |
| 6,543,949 B1 | 4/2003 | Ritchey et al. |
| 6,565,439 B2 | 5/2003 | Shinohara et al. |
| 6,585,435 B2 | 7/2003 | Fang |
| 6,597,347 B1 | 7/2003 | Yasutake |
| 6,600,121 B1 | 7/2003 | Olodort et al. |
| 6,603,408 B1 | 8/2003 | Gaba |
| 6,603,461 B2 | 8/2003 | Smith, Jr. et al. |
| 6,608,664 B1 | 8/2003 | Hasegawa |
| 6,617,536 B2 | 9/2003 | Kawaguchi |
| 6,651,943 B2 | 11/2003 | Cho et al. |
| 6,684,166 B2 | 1/2004 | Bellwood et al. |
| 6,685,369 B2 | 2/2004 | Lien |
| 6,687,614 B2 | 2/2004 | Ihara et al. |
| 6,695,273 B2 | 2/2004 | Iguchi |
| 6,704,864 B1 | 3/2004 | Philyaw |
| 6,721,019 B2 | 4/2004 | Kono et al. |
| 6,725,318 B1 | 4/2004 | Sherman et al. |
| 6,774,888 B1 | 8/2004 | Genduso |
| 6,776,546 B2 | 8/2004 | Kraus et al. |
| 6,780,019 B1 | 8/2004 | Ghosh et al. |
| 6,781,819 B2 | 8/2004 | Yang et al. |

(56) References Cited

U.S. PATENT DOCUMENTS

| | | |
|---|---|---|
| 6,784,869 B1 | 8/2004 | Clark et al. |
| 6,798,887 B1 | 9/2004 | Andre |
| 6,813,143 B2 | 11/2004 | Makela |
| 6,819,316 B2 | 11/2004 | Schulz et al. |
| 6,856,506 B2 | 2/2005 | Doherty et al. |
| 6,856,789 B2 | 2/2005 | Pattabiraman et al. |
| 6,861,961 B2 | 3/2005 | Sandbach et al. |
| 6,898,315 B2 | 5/2005 | Guha |
| 6,909,354 B2 | 6/2005 | Baker et al. |
| 6,914,197 B2 | 7/2005 | Doherty et al. |
| 6,950,950 B2 | 9/2005 | Sawyers et al. |
| 6,962,454 B1 | 11/2005 | Costello |
| 6,970,957 B1 | 11/2005 | Oshins et al. |
| 6,976,799 B2 | 12/2005 | Kim et al. |
| 7,007,238 B2 | 2/2006 | Glaser |
| 7,051,149 B2 | 5/2006 | Wang et al. |
| 7,068,496 B2 | 6/2006 | Wong et al. |
| 7,083,295 B1 | 8/2006 | Hanna |
| 7,091,436 B2 | 8/2006 | Serban |
| 7,095,404 B2 | 8/2006 | Vincent et al. |
| 7,099,149 B2 | 8/2006 | Krieger et al. |
| 7,106,222 B2 | 9/2006 | Ward et al. |
| 7,116,309 B1 | 10/2006 | Kimura et al. |
| 7,123,292 B1 | 10/2006 | Seeger et al. |
| 7,136,282 B1 | 11/2006 | Rebeske |
| D535,292 S | 1/2007 | Shi et al. |
| 7,194,662 B2 | 3/2007 | Do et al. |
| 7,213,323 B2 | 5/2007 | Baker et al. |
| 7,213,991 B2 | 5/2007 | Chapman et al. |
| 7,224,830 B2 | 5/2007 | Nefian et al. |
| 7,252,512 B2 | 8/2007 | Tai et al. |
| 7,260,221 B1 | 8/2007 | Atsmon |
| 7,277,087 B2 | 10/2007 | Hill et al. |
| 7,301,759 B2 | 11/2007 | Hsiung |
| 7,365,967 B2 | 4/2008 | Zheng |
| 7,374,312 B2 | 5/2008 | Feng et al. |
| 7,415,676 B2 | 8/2008 | Fujita |
| 7,447,934 B2 | 11/2008 | Dasari et al. |
| 7,457,108 B2 | 11/2008 | Ghosh |
| 7,469,386 B2 | 12/2008 | Bear et al. |
| 7,486,165 B2 | 2/2009 | Ligtenberg et al. |
| 7,499,037 B2 | 3/2009 | Lube |
| 7,502,803 B2 | 3/2009 | Culter et al. |
| 7,542,052 B2 | 6/2009 | Solomon et al. |
| 7,558,594 B2 | 7/2009 | Wilson |
| 7,559,834 B1 | 7/2009 | York |
| RE40,891 E | 9/2009 | Yasutake |
| 7,594,638 B2 | 9/2009 | Chan et al. |
| 7,620,244 B1 | 11/2009 | Collier |
| 7,636,921 B2 | 12/2009 | Louie |
| 7,639,329 B2 | 12/2009 | Takeda et al. |
| 7,639,876 B2 | 12/2009 | Clary et al. |
| 7,656,392 B2 | 2/2010 | Bolender |
| 7,728,923 B2 | 6/2010 | Kim et al. |
| 7,729,493 B2 | 6/2010 | Krieger et al. |
| 7,731,147 B2 | 6/2010 | Rha |
| 7,733,326 B1 | 6/2010 | Adiseshan |
| 7,761,119 B2 | 7/2010 | Patel |
| 7,773,076 B2 | 8/2010 | Pittel et al. |
| 7,773,121 B1 | 8/2010 | Huntsberger et al. |
| 7,774,155 B2 | 8/2010 | Sato et al. |
| 7,777,972 B1 | 8/2010 | Chen et al. |
| 7,782,342 B2 | 8/2010 | Koh |
| 7,813,715 B2 | 10/2010 | McKillop et al. |
| 7,815,358 B2 | 10/2010 | Inditsky |
| 7,822,338 B2 | 10/2010 | Wernersson |
| 7,865,639 B2 | 1/2011 | McCoy et al. |
| 7,884,807 B2 | 2/2011 | Hovden et al. |
| 7,893,921 B2 | 2/2011 | Sato |
| D636,397 S | 4/2011 | Green |
| 7,928,964 B2 | 4/2011 | Kolmykov-Zotov et al. |
| 7,932,890 B2 | 4/2011 | Onikiri et al. |
| 7,936,501 B2 | 5/2011 | Smith et al. |
| 7,944,520 B2 | 5/2011 | Ichioka et al. |
| 7,945,717 B2 | 5/2011 | Rivalsi |
| 7,970,246 B2 | 6/2011 | Travis et al. |
| 7,973,771 B2 | 7/2011 | Geaghan |
| 7,978,281 B2 | 7/2011 | Vergith et al. |
| 8,016,255 B2 | 9/2011 | Lin |
| 8,018,386 B2 | 9/2011 | Qi et al. |
| 8,018,579 B1 | 9/2011 | Krah |
| 8,026,904 B2 | 9/2011 | Westerman |
| 8,053,688 B2 | 11/2011 | Conzola et al. |
| 8,059,384 B2 | 11/2011 | Park et al. |
| 8,065,624 B2 | 11/2011 | Morin et al. |
| 8,069,356 B2 | 11/2011 | Rathi et al. |
| 8,077,160 B2 | 12/2011 | Land et al. |
| 8,090,885 B2 | 1/2012 | Callaghan et al. |
| 8,098,233 B2 | 1/2012 | Hotelling et al. |
| 8,115,499 B2 | 2/2012 | Osoinach et al. |
| 8,117,362 B2 | 2/2012 | Rodriguez et al. |
| 8,118,274 B2 | 2/2012 | McClure et al. |
| 8,120,166 B2 | 2/2012 | Koizumi et al. |
| 8,130,203 B2 | 3/2012 | Westerman |
| 8,149,219 B2 | 4/2012 | Lii et al. |
| 8,154,524 B2 | 4/2012 | Wilson et al. |
| 8,159,372 B2 | 4/2012 | Sherman |
| 8,162,282 B2 | 4/2012 | Hu et al. |
| D659,139 S | 5/2012 | Gengler |
| 8,169,421 B2 | 5/2012 | Wright et al. |
| 8,189,973 B2 | 5/2012 | Travis et al. |
| 8,229,509 B2 | 7/2012 | Paek et al. |
| 8,229,522 B2 | 7/2012 | Kim et al. |
| 8,231,099 B2 | 7/2012 | Chen |
| 8,243,432 B2 | 8/2012 | Duan et al. |
| 8,248,791 B2 | 8/2012 | Wang et al. |
| 8,255,708 B1 | 8/2012 | Zhang |
| 8,264,310 B2 | 9/2012 | Lauder et al. |
| 8,267,368 B2 | 9/2012 | Torii et al. |
| 8,269,731 B2 | 9/2012 | Molne |
| 8,274,784 B2 | 9/2012 | Franz et al. |
| 8,279,589 B2 | 10/2012 | Kim |
| 8,322,290 B1 | 12/2012 | Mignano |
| 8,346,206 B1 | 1/2013 | Andrus et al. |
| 8,373,664 B2 | 2/2013 | Wright |
| 8,384,566 B2 | 2/2013 | Bocirnea |
| 8,387,078 B2 | 2/2013 | Memmott |
| 8,387,938 B2 | 3/2013 | Lin |
| 8,403,576 B2 | 3/2013 | Merz |
| 8,416,559 B2 | 4/2013 | Agata et al. |
| 8,424,160 B2 | 4/2013 | Chen |
| 8,498,100 B1 | 7/2013 | Whitt, III et al. |
| 8,514,568 B2 | 8/2013 | Qiao et al. |
| 8,520,371 B2 | 8/2013 | Peng et al. |
| 8,543,227 B1 | 9/2013 | Perek et al. |
| 8,548,608 B2 | 10/2013 | Perek et al. |
| 8,564,944 B2 | 10/2013 | Whitt, III et al. |
| 8,570,725 B2 | 10/2013 | Whitt, III et al. |
| 8,582,280 B2 | 11/2013 | Ryu |
| 8,587,701 B2 | 11/2013 | Tatsuzawa |
| 8,599,542 B1 | 12/2013 | Healey et al. |
| 8,610,015 B2 | 12/2013 | Whitt et al. |
| 8,614,666 B2 | 12/2013 | Whitman et al. |
| 8,646,999 B2 | 2/2014 | Shaw et al. |
| 8,674,941 B2 | 3/2014 | Casparian et al. |
| 8,699,215 B2 | 4/2014 | Whitt, III et al. |
| 8,719,603 B2 | 5/2014 | Belesiu |
| 8,724,302 B2 | 5/2014 | Whitt, III et al. |
| 8,744,070 B2 | 6/2014 | Zhang et al. |
| 8,744,391 B2 | 6/2014 | Tenbrook et al. |
| 8,762,746 B1 | 6/2014 | Lachwani et al. |
| 8,767,388 B2 | 7/2014 | Ahn et al. |
| 8,780,540 B2 | 7/2014 | Whitt, III et al. |
| 8,780,541 B2 | 7/2014 | Whitt, III et al. |
| 8,791,382 B2 | 7/2014 | Whitt, III et al. |
| 8,797,765 B2 | 8/2014 | Lin et al. |
| 8,825,187 B1 | 9/2014 | Hamrick et al. |
| 8,830,668 B2 | 9/2014 | Whitt, III et al. |
| 8,850,241 B2 | 9/2014 | Oler et al. |
| 8,854,799 B2 | 10/2014 | Whitt, III et al. |
| 8,873,227 B2 | 10/2014 | Whitt et al. |
| 8,891,232 B2 | 11/2014 | Wang |
| 8,896,993 B2 | 11/2014 | Belesiu et al. |
| 8,903,517 B2 | 12/2014 | Perek et al. |

(56) References Cited

U.S. PATENT DOCUMENTS

| | | |
|---|---|---|
| 8,908,858 B2 | 12/2014 | Chiu et al. |
| 8,934,221 B2 | 1/2015 | Guo |
| 8,935,774 B2 | 1/2015 | Belesiu et al. |
| 8,939,422 B2 | 1/2015 | Liu et al. |
| 8,947,864 B2 | 2/2015 | Whitt, III et al. |
| 8,964,376 B2 | 2/2015 | Chen |
| 2001/0023818 A1 | 9/2001 | Masaru et al. |
| 2002/0005108 A1 | 1/2002 | Ludwig |
| 2002/0044216 A1 | 4/2002 | Cha |
| 2002/0134828 A1 | 9/2002 | Sandbach et al. |
| 2002/0135457 A1 | 9/2002 | Sandbach et al. |
| 2003/0007648 A1 | 1/2003 | Currell |
| 2003/0011576 A1 | 1/2003 | Sandbach et al. |
| 2003/0016282 A1 | 1/2003 | Koizumi |
| 2003/0051983 A1 | 3/2003 | Lahr |
| 2003/0067450 A1 | 4/2003 | Thursfield et al. |
| 2003/0108720 A1 | 6/2003 | Kashino |
| 2003/0163611 A1 | 8/2003 | Nagao |
| 2003/0173195 A1 | 9/2003 | Federspiel |
| 2003/0197687 A1 | 10/2003 | Shetter |
| 2003/0198008 A1 | 10/2003 | Leapman et al. |
| 2003/0231243 A1 | 12/2003 | Shibutani |
| 2004/0005184 A1 | 1/2004 | Kim et al. |
| 2004/0046796 A1 | 3/2004 | Fujita |
| 2004/0056843 A1 | 3/2004 | Lin et al. |
| 2004/0113956 A1 | 6/2004 | Bellwood et al. |
| 2004/0115994 A1 | 6/2004 | Wulff et al. |
| 2004/0156168 A1 | 8/2004 | LeVasseur et al. |
| 2004/0160734 A1 | 8/2004 | Yim |
| 2004/0169641 A1 | 9/2004 | Bean et al. |
| 2004/0212598 A1 | 10/2004 | Kraus et al. |
| 2004/0212601 A1 | 10/2004 | Cake et al. |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0047773 A1 | 3/2005 | Satake et al. |
| 2005/0052831 A1 | 3/2005 | Chen |
| 2005/0055498 A1 | 3/2005 | Beckert et al. |
| 2005/0057515 A1 | 3/2005 | Bathiche |
| 2005/0059489 A1 | 3/2005 | Kim |
| 2005/0062715 A1 | 3/2005 | Tsuji et al. |
| 2005/0099400 A1 | 5/2005 | Lee |
| 2005/0134717 A1 | 6/2005 | Misawa |
| 2005/0146512 A1* | 7/2005 | Hill et al. .................. 345/173 |
| 2005/0236848 A1 | 10/2005 | Kim et al. |
| 2005/0264653 A1 | 12/2005 | Starkweather et al. |
| 2005/0264988 A1 | 12/2005 | Nicolosi |
| 2005/0283731 A1 | 12/2005 | Saint-Hilaire et al. |
| 2005/0285703 A1 | 12/2005 | Wheeler et al. |
| 2006/0049920 A1 | 3/2006 | Sadler et al. |
| 2006/0049993 A1 | 3/2006 | Lin et al. |
| 2006/0061555 A1 | 3/2006 | Mullen |
| 2006/0085658 A1 | 4/2006 | Allen et al. |
| 2006/0092139 A1 | 5/2006 | Sharma |
| 2006/0096392 A1 | 5/2006 | Inkster et al. |
| 2006/0102914 A1 | 5/2006 | Smits et al. |
| 2006/0125799 A1 | 6/2006 | Hillis et al. |
| 2006/0132423 A1 | 6/2006 | Travis |
| 2006/0154725 A1 | 7/2006 | Glaser et al. |
| 2006/0155391 A1 | 7/2006 | Pistemaa et al. |
| 2006/0156415 A1 | 7/2006 | Rubinstein et al. |
| 2006/0174143 A1 | 8/2006 | Sawyers et al. |
| 2006/0176377 A1 | 8/2006 | Miyasaka |
| 2006/0181514 A1 | 8/2006 | Newman |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2007/0003267 A1 | 1/2007 | Shibutani |
| 2007/0047221 A1 | 3/2007 | Park |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0117600 A1 | 5/2007 | Robertson et al. |
| 2007/0121956 A1 | 5/2007 | Bai et al. |
| 2007/0145945 A1 | 6/2007 | McGinley et al. |
| 2007/0172229 A1 | 7/2007 | Wernersson |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0200830 A1 | 8/2007 | Yamamoto |
| 2007/0220708 A1 | 9/2007 | Lewis |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0236873 A1 | 10/2007 | Yukawa et al. |
| 2007/0247432 A1 | 10/2007 | Oakley |
| 2007/0252674 A1 | 11/2007 | Nelson et al. |
| 2007/0260892 A1 | 11/2007 | Paul et al. |
| 2007/0274094 A1 | 11/2007 | Schultz et al. |
| 2007/0274095 A1 | 11/2007 | Destain |
| 2007/0283179 A1 | 12/2007 | Burnett et al. |
| 2007/0296709 A1 | 12/2007 | Guanghai |
| 2007/0297625 A1 | 12/2007 | Hjort et al. |
| 2008/0005423 A1 | 1/2008 | Jacobs et al. |
| 2008/0013809 A1 | 1/2008 | Zhu et al. |
| 2008/0053222 A1 | 3/2008 | Ehrensvard et al. |
| 2008/0059888 A1* | 3/2008 | Dunko .................. 715/744 |
| 2008/0074398 A1 | 3/2008 | Wright |
| 2008/0104437 A1 | 5/2008 | Lee |
| 2008/0129520 A1 | 6/2008 | Lee |
| 2008/0151478 A1 | 6/2008 | Chern |
| 2008/0158185 A1 | 7/2008 | Westerman |
| 2008/0167832 A1 | 7/2008 | Soss |
| 2008/0174570 A1 | 7/2008 | Jobs et al. |
| 2008/0186660 A1 | 8/2008 | Yang |
| 2008/0219025 A1 | 9/2008 | Spitzer et al. |
| 2008/0228969 A1 | 9/2008 | Cheah et al. |
| 2008/0238884 A1 | 10/2008 | Harish |
| 2008/0253822 A1 | 10/2008 | Matias |
| 2008/0297878 A1 | 12/2008 | Brown et al. |
| 2008/0307242 A1 | 12/2008 | Qu |
| 2008/0309636 A1 | 12/2008 | Feng et al. |
| 2008/0316002 A1 | 12/2008 | Brunet et al. |
| 2008/0316183 A1 | 12/2008 | Westerman et al. |
| 2008/0320190 A1 | 12/2008 | Lydon et al. |
| 2009/0009476 A1 | 1/2009 | Daley, III |
| 2009/0073060 A1 | 3/2009 | Shimasaki et al. |
| 2009/0073957 A1 | 3/2009 | Newland et al. |
| 2009/0079639 A1 | 3/2009 | Hotta et al. |
| 2009/0083562 A1* | 3/2009 | Park et al. .................. 713/323 |
| 2009/0089609 A1 | 4/2009 | Nousiainen |
| 2009/0096756 A1 | 4/2009 | Lube |
| 2009/0102805 A1 | 4/2009 | Meijer et al. |
| 2009/0127005 A1 | 5/2009 | Zachut et al. |
| 2009/0140985 A1 | 6/2009 | Liu |
| 2009/0163147 A1 | 6/2009 | Steigerwald et al. |
| 2009/0174687 A1 | 7/2009 | Ciesla et al. |
| 2009/0174759 A1 | 7/2009 | Yeh et al. |
| 2009/0189873 A1 | 7/2009 | Peterson |
| 2009/0195497 A1 | 8/2009 | Fitzgerald et al. |
| 2009/0195518 A1 | 8/2009 | Mattice et al. |
| 2009/0207144 A1 | 8/2009 | Bridger |
| 2009/0231275 A1 | 9/2009 | Odgers |
| 2009/0239586 A1 | 9/2009 | Boeve et al. |
| 2009/0244832 A1 | 10/2009 | Behar et al. |
| 2009/0244872 A1 | 10/2009 | Yan |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0285491 A1 | 11/2009 | Ravenscroft et al. |
| 2009/0296331 A1 | 12/2009 | Choy |
| 2009/0303137 A1 | 12/2009 | Kusaka et al. |
| 2009/0303204 A1 | 12/2009 | Nasiri et al. |
| 2009/0315830 A1 | 12/2009 | Westerman |
| 2009/0320244 A1 | 12/2009 | Lin |
| 2009/0321490 A1 | 12/2009 | Groene et al. |

(56) References Cited

U.S. PATENT DOCUMENTS

| | | |
|---|---|---|
| 2010/0001963 A1 | 1/2010 | Doray et al. |
| 2010/0013319 A1 | 1/2010 | Kamiyama et al. |
| 2010/0023869 A1 | 1/2010 | Saint-Hilaire et al. |
| 2010/0026656 A1 | 2/2010 | Hotelling et al. |
| 2010/0038821 A1 | 2/2010 | Jenkins et al. |
| 2010/0039081 A1 | 2/2010 | Sip |
| 2010/0039764 A1 | 2/2010 | Locker et al. |
| 2010/0045609 A1 | 2/2010 | Do et al. |
| 2010/0045633 A1 | 2/2010 | Gettemy |
| 2010/0051356 A1 | 3/2010 | Stern et al. |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0054435 A1 | 3/2010 | Louch et al. |
| 2010/0056130 A1 | 3/2010 | Louch et al. |
| 2010/0073329 A1 | 3/2010 | Raman et al. |
| 2010/0077237 A1 | 3/2010 | Sawyers |
| 2010/0079379 A1 | 4/2010 | Demuynck et al. |
| 2010/0081377 A1 | 4/2010 | Chatterjee et al. |
| 2010/0083108 A1 | 4/2010 | Rider et al. |
| 2010/0085321 A1 | 4/2010 | Pundsack |
| 2010/0102182 A1 | 4/2010 | Lin |
| 2010/0103112 A1 | 4/2010 | Yoo et al. |
| 2010/0105443 A1 | 4/2010 | Vaisanen |
| 2010/0106983 A1 | 4/2010 | Kasprzak et al. |
| 2010/0117993 A1 | 5/2010 | Kent |
| 2010/0123686 A1 | 5/2010 | Klinghult et al. |
| 2010/0133398 A1 | 6/2010 | Chiu et al. |
| 2010/0142130 A1 | 6/2010 | Wang et al. |
| 2010/0148995 A1 | 6/2010 | Elias |
| 2010/0148999 A1 | 6/2010 | Casparian et al. |
| 2010/0149104 A1 | 6/2010 | Sim et al. |
| 2010/0149111 A1 | 6/2010 | Olien |
| 2010/0149134 A1 | 6/2010 | Westerman et al. |
| 2010/0149377 A1 | 6/2010 | Shintani et al. |
| 2010/0156798 A1 | 6/2010 | Archer |
| 2010/0156913 A1 | 6/2010 | Ortega et al. |
| 2010/0161522 A1 | 6/2010 | Tirpak et al. |
| 2010/0164857 A1 | 7/2010 | Liu et al. |
| 2010/0164897 A1 | 7/2010 | Morin et al. |
| 2010/0171891 A1 | 7/2010 | Kaji et al. |
| 2010/0174421 A1 | 7/2010 | Tsai et al. |
| 2010/0180063 A1 | 7/2010 | Ananny et al. |
| 2010/0188299 A1 | 7/2010 | Rinehart et al. |
| 2010/0205472 A1 | 8/2010 | Tupman et al. |
| 2010/0206614 A1 | 8/2010 | Park et al. |
| 2010/0206644 A1 | 8/2010 | Yeh |
| 2010/0214257 A1 | 8/2010 | Wussler et al. |
| 2010/0222110 A1 | 9/2010 | Kim et al. |
| 2010/0231498 A1 | 9/2010 | Large et al. |
| 2010/0231510 A1 | 9/2010 | Sampsell et al. |
| 2010/0231556 A1 | 9/2010 | Mines et al. |
| 2010/0235546 A1 | 9/2010 | Terlizzi et al. |
| 2010/0238075 A1 | 9/2010 | Pourseyed |
| 2010/0238138 A1 | 9/2010 | Goertz et al. |
| 2010/0238620 A1 | 9/2010 | Fish |
| 2010/0245221 A1 | 9/2010 | Khan |
| 2010/0250988 A1 | 9/2010 | Okuda et al. |
| 2010/0259482 A1 | 10/2010 | Ball |
| 2010/0259876 A1 | 10/2010 | Kim |
| 2010/0265182 A1 | 10/2010 | Ball et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0289457 A1 | 11/2010 | Onnerud et al. |
| 2010/0295812 A1 | 11/2010 | Burns et al. |
| 2010/0302378 A1 | 12/2010 | Marks et al. |
| 2010/0304793 A1 | 12/2010 | Kim |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0309617 A1 | 12/2010 | Wang et al. |
| 2010/0313680 A1 | 12/2010 | Joung et al. |
| 2010/0315348 A1 | 12/2010 | Jellicoe et al. |
| 2010/0315373 A1 | 12/2010 | Steinhauser et al. |
| 2010/0321339 A1 | 12/2010 | Kimmel |
| 2010/0321877 A1 | 12/2010 | Moser |
| 2010/0324457 A1 | 12/2010 | Bean et al. |
| 2010/0325155 A1 | 12/2010 | Skinner et al. |
| 2010/0331059 A1 | 12/2010 | Apgar et al. |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0032127 A1 | 2/2011 | Roush |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0050576 A1 | 3/2011 | Forutanpour et al. |
| 2011/0050626 A1 | 3/2011 | Porter et al. |
| 2011/0055407 A1 | 3/2011 | Lydon et al. |
| 2011/0057724 A1 | 3/2011 | Pabon |
| 2011/0060926 A1 | 3/2011 | Brooks et al. |
| 2011/0069148 A1 | 3/2011 | Jones et al. |
| 2011/0074688 A1 | 3/2011 | Hull et al. |
| 2011/0102326 A1 | 5/2011 | Casparian et al. |
| 2011/0102356 A1 | 5/2011 | Kemppinen et al. |
| 2011/0102752 A1 | 5/2011 | Chen et al. |
| 2011/0107958 A1 | 5/2011 | Pance et al. |
| 2011/0113368 A1 | 5/2011 | Carvajal et al. |
| 2011/0115738 A1 | 5/2011 | Suzuki et al. |
| 2011/0115747 A1 | 5/2011 | Powell et al. |
| 2011/0117970 A1 | 5/2011 | Choi |
| 2011/0134032 A1 | 6/2011 | Chiu et al. |
| 2011/0134043 A1 | 6/2011 | Chen |
| 2011/0134112 A1 | 6/2011 | Koh et al. |
| 2011/0157046 A1 | 6/2011 | Lee et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0167992 A1 | 7/2011 | Eventoff et al. |
| 2011/0169762 A1 | 7/2011 | Weiss |
| 2011/0176035 A1 | 7/2011 | Poulsen |
| 2011/0179864 A1 * | 7/2011 | Raasch et al. ............... 73/493 |
| 2011/0184646 A1 | 7/2011 | Wong et al. |
| 2011/0184824 A1 | 7/2011 | George et al. |
| 2011/0188199 A1 | 8/2011 | Pan |
| 2011/0193787 A1 | 8/2011 | Morishige et al. |
| 2011/0193938 A1 | 8/2011 | Oderwald et al. |
| 2011/0202878 A1 | 8/2011 | Park et al. |
| 2011/0205372 A1 | 8/2011 | Miramontes |
| 2011/0216266 A1 | 9/2011 | Travis |
| 2011/0221678 A1 | 9/2011 | Davydov |
| 2011/0227913 A1 | 9/2011 | Hyndman |
| 2011/0231682 A1 | 9/2011 | Kakish et al. |
| 2011/0242138 A1 | 10/2011 | Tribble |
| 2011/0248152 A1 | 10/2011 | Svajda et al. |
| 2011/0248920 A1 | 10/2011 | Larsen |
| 2011/0248941 A1 | 10/2011 | Abdo et al. |
| 2011/0261001 A1 | 10/2011 | Liu |
| 2011/0261083 A1 | 10/2011 | Wilson |
| 2011/0265287 A1 | 11/2011 | Li et al. |
| 2011/0266672 A1 | 11/2011 | Sylvester |
| 2011/0267272 A1 | 11/2011 | Meyer et al. |
| 2011/0273475 A1 | 11/2011 | Herz et al. |
| 2011/0290686 A1 | 12/2011 | Huang |
| 2011/0295697 A1 | 12/2011 | Boston et al. |
| 2011/0297566 A1 | 12/2011 | Gallagher et al. |
| 2011/0298919 A1 | 12/2011 | Maglaque |
| 2011/0302518 A1 | 12/2011 | Zhang |
| 2011/0304577 A1 | 12/2011 | Brown |
| 2011/0305875 A1 | 12/2011 | Sanford et al. |
| 2011/0316807 A1 | 12/2011 | Corrion |
| 2011/0320204 A1 | 12/2011 | Locker et al. |
| 2012/0002820 A1 | 1/2012 | Leichter |
| 2012/0007821 A1 | 1/2012 | Zaliva |
| 2012/0011462 A1 | 1/2012 | Westerman et al. |
| 2012/0013519 A1 | 1/2012 | Hakansson et al. |
| 2012/0020490 A1 | 1/2012 | Leichter |
| 2012/0023401 A1 | 1/2012 | Arscott et al. |
| 2012/0023459 A1 | 1/2012 | Westerman |
| 2012/0024682 A1 | 2/2012 | Huang et al. |

(56) References Cited

U.S. PATENT DOCUMENTS

| | | |
|---|---|---|
| 2012/0026048 A1 | 2/2012 | Vazquez et al. |
| 2012/0026096 A1 | 2/2012 | Ku |
| 2012/0032887 A1 | 2/2012 | Chiu et al. |
| 2012/0032891 A1 | 2/2012 | Parivar |
| 2012/0032901 A1 | 2/2012 | Kwon |
| 2012/0038495 A1 | 2/2012 | Ishikawa |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0062564 A1 | 3/2012 | Miyashita |
| 2012/0068919 A1 | 3/2012 | Lauder et al. |
| 2012/0069540 A1* | 3/2012 | Lauder et al. ............... 361/807 |
| 2012/0075249 A1 | 3/2012 | Hoch |
| 2012/0077384 A1 | 3/2012 | Bar-Niv et al. |
| 2012/0081316 A1 | 4/2012 | Sirpal et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0103778 A1 | 5/2012 | Obata et al. |
| 2012/0113137 A1 | 5/2012 | Nomoto |
| 2012/0113579 A1 | 5/2012 | Agata et al. |
| 2012/0115553 A1 | 5/2012 | Mahe et al. |
| 2012/0117409 A1 | 5/2012 | Lee et al. |
| 2012/0127118 A1 | 5/2012 | Nolting et al. |
| 2012/0139727 A1 | 6/2012 | Houvener et al. |
| 2012/0140396 A1* | 6/2012 | Zeliff et al. ............... 361/679.09 |
| 2012/0145525 A1 | 6/2012 | Ishikawa |
| 2012/0162693 A1 | 6/2012 | Ito |
| 2012/0175487 A1 | 7/2012 | Goto |
| 2012/0182242 A1 | 7/2012 | Lindahl et al. |
| 2012/0182249 A1 | 7/2012 | Endo et al. |
| 2012/0194393 A1 | 8/2012 | Utterman et al. |
| 2012/0194448 A1 | 8/2012 | Rothkopf |
| 2012/0200802 A1 | 8/2012 | Large |
| 2012/0206937 A1 | 8/2012 | Travis et al. |
| 2012/0212438 A1 | 8/2012 | Vaisanen |
| 2012/0218194 A1 | 8/2012 | Silverman |
| 2012/0223866 A1 | 9/2012 | Ayala Vazquez et al. |
| 2012/0224073 A1 | 9/2012 | Miyahara |
| 2012/0227259 A1 | 9/2012 | Badaye et al. |
| 2012/0229634 A1 | 9/2012 | Laett et al. |
| 2012/0235635 A1 | 9/2012 | Sato |
| 2012/0242584 A1 | 9/2012 | Tuli |
| 2012/0243165 A1 | 9/2012 | Chang et al. |
| 2012/0246377 A1 | 9/2012 | Bhesania |
| 2012/0249443 A1 | 10/2012 | Anderson et al. |
| 2012/0250873 A1 | 10/2012 | Bakalos et al. |
| 2012/0256959 A1 | 10/2012 | Ye et al. |
| 2012/0260177 A1 | 10/2012 | Sehrer |
| 2012/0274811 A1 | 11/2012 | Bakin |
| 2012/0298491 A1 | 11/2012 | Ozias et al. |
| 2012/0299872 A1 | 11/2012 | Nishikawa et al. |
| 2012/0300275 A1 | 11/2012 | Vilardell et al. |
| 2012/0312955 A1 | 12/2012 | Randolph |
| 2013/0009413 A1 | 1/2013 | Chiu et al. |
| 2013/0015311 A1 | 1/2013 | Kim |
| 2013/0016468 A1 | 1/2013 | Oh |
| 2013/0027867 A1 | 1/2013 | Lauder et al. |
| 2013/0044059 A1 | 2/2013 | Fu |
| 2013/0044074 A1 | 2/2013 | Park et al. |
| 2013/0046397 A1 | 2/2013 | Fadell et al. |
| 2013/0063873 A1 | 3/2013 | Wodrich et al. |
| 2013/0067126 A1 | 3/2013 | Casparian et al. |
| 2013/0073877 A1 | 3/2013 | Radke |
| 2013/0076617 A1 | 3/2013 | Csaszar et al. |
| 2013/0076635 A1 | 3/2013 | Lin |
| 2013/0082824 A1 | 4/2013 | Colley |
| 2013/0088431 A1* | 4/2013 | Ballagas et al. ............... 345/168 |
| 2013/0106766 A1 | 5/2013 | Yilmaz et al. |
| 2013/0107144 A1 | 5/2013 | Marhefka et al. |
| 2013/0135214 A1 | 5/2013 | Li et al. |
| 2013/0162554 A1 | 6/2013 | Lauder et al. |
| 2013/0172906 A1 | 7/2013 | Olson et al. |
| 2013/0191741 A1 | 7/2013 | Dickinson et al. |
| 2013/0217451 A1 | 8/2013 | Komiyama et al. |
| 2013/0227836 A1 | 9/2013 | Whitt, III |
| 2013/0228023 A1 | 9/2013 | Drasnin |
| 2013/0228433 A1 | 9/2013 | Shaw |
| 2013/0228434 A1 | 9/2013 | Whitt, III |
| 2013/0228435 A1 | 9/2013 | Whitt, III |
| 2013/0228439 A1 | 9/2013 | Whitt, III |
| 2013/0229100 A1 | 9/2013 | Siddiqui |
| 2013/0229335 A1 | 9/2013 | Whitman |
| 2013/0229347 A1 | 9/2013 | Lutz, III |
| 2013/0229350 A1 | 9/2013 | Shaw |
| 2013/0229351 A1 | 9/2013 | Whitt, III |
| 2013/0229354 A1 | 9/2013 | Whitt, III |
| 2013/0229356 A1 | 9/2013 | Marwah |
| 2013/0229363 A1 | 9/2013 | Whitman |
| 2013/0229366 A1 | 9/2013 | Dighde |
| 2013/0229380 A1 | 9/2013 | Lutz, III |
| 2013/0229386 A1 | 9/2013 | Bathiche |
| 2013/0229534 A1 | 9/2013 | Panay |
| 2013/0229570 A1 | 9/2013 | Beck et al. |
| 2013/0229756 A1 | 9/2013 | Whitt, III |
| 2013/0229757 A1 | 9/2013 | Whitt, III |
| 2013/0229758 A1 | 9/2013 | Belesiu |
| 2013/0229759 A1 | 9/2013 | Whitt, III |
| 2013/0229760 A1 | 9/2013 | Whitt, III |
| 2013/0229761 A1 | 9/2013 | Shaw |
| 2013/0229762 A1 | 9/2013 | Whitt, III |
| 2013/0229773 A1 | 9/2013 | Siddiqui |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0241860 A1 | 9/2013 | Ciesla et al. |
| 2013/0242495 A1 | 9/2013 | Bathiche et al. |
| 2013/0262886 A1 | 10/2013 | Nishimura |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0321992 A1 | 12/2013 | Liu et al. |
| 2013/0322000 A1 | 12/2013 | Whitt |
| 2013/0322001 A1 | 12/2013 | Whitt |
| 2013/0329360 A1 | 12/2013 | Aldana |
| 2013/0332628 A1 | 12/2013 | Panay |
| 2013/0339757 A1 | 12/2013 | Reddy |
| 2013/0342976 A1 | 12/2013 | Chung |
| 2014/0012401 A1 | 1/2014 | Perek |
| 2014/0043275 A1 | 2/2014 | Whitman |
| 2014/0048399 A1 | 2/2014 | Whitt, III |
| 2014/0085814 A1 | 3/2014 | Kielland |
| 2014/0119802 A1 | 5/2014 | Shaw |
| 2014/0132550 A1 | 5/2014 | McCracken et al. |
| 2014/0167585 A1 | 6/2014 | Kuan et al. |
| 2014/0185215 A1 | 7/2014 | Whitt |
| 2014/0185220 A1 | 7/2014 | Whitt |
| 2014/0204514 A1 | 7/2014 | Whitt |
| 2014/0204515 A1 | 7/2014 | Whitt |
| 2014/0247546 A1 | 9/2014 | Whitt |
| 2014/0291134 A1 | 10/2014 | Whitt |
| 2014/0293534 A1 | 10/2014 | Siddiqui |
| 2014/0362506 A1 | 12/2014 | Whitt, III et al. |
| 2014/0379942 A1 | 12/2014 | Perek et al. |
| 2015/0005953 A1 | 1/2015 | Fadell et al. |
| 2015/0036274 A1 | 2/2015 | Belesui et al. |

FOREIGN PATENT DOCUMENTS

| | | |
|---|---|---|
| EP | 1223722 | 7/2002 |
| EP | 1480029 | 11/2004 |
| EP | 1591891 | 11/2005 |
| EP | 2026178 | 2/2009 |
| EP | 2353978 | 8/2011 |
| GB | 2123213 | 1/1984 |
| JP | 56108127 | 8/1981 |
| JP | 10326124 | 12/1998 |

(56) References Cited

FOREIGN PATENT DOCUMENTS

| | | |
|---|---|---|
| JP | 1173239 | 3/1999 |
| JP | 11338575 | 12/1999 |
| JP | 2000010654 | 1/2000 |
| JP | 2001142564 | 5/2001 |
| JP | 2004038950 | 2/2004 |
| JP | 2006163459 | 6/2006 |
| JP | 2006294361 | 10/2006 |
| JP | 2010244514 | 10/2010 |
| KR | 20010107055 | 12/2001 |
| KR | 20040066647 | 7/2004 |
| KR | 20050014299 | 2/2005 |
| KR | 20060003093 | 1/2006 |
| KR | 20080006404 | 1/2008 |
| KR | 20090029411 | 3/2009 |
| KR | 20100022059 | 2/2010 |
| KR | 20100067366 | 6/2010 |
| KR | 20100115675 | 10/2010 |
| KR | 1020110087178 | 8/2011 |
| KR | 20110109791 | 10/2011 |
| KR | 20110120002 | 11/2011 |
| KR | 20110122333 | 11/2011 |
| KR | 101113530 | 2/2012 |
| WO | WO9919995 | 4/1999 |
| WO | WO-2006044818 | 4/2006 |
| WO | WO 2007112172 | 10/2007 |
| WO | WO 2009034484 | 3/2009 |
| WO | WO 2011049609 | 4/2011 |

OTHER PUBLICATIONS

"ACPI Docking for Windows Operating Systems", Retrieved from: <http://www.scritube.com/limba/engleza/software/ACPI-Docking-for-Windows-Opera331824193.php> on Jul. 6, 2012, 10 pages.

"First One Handed Fabric Keyboard with Bluetooth Wireless Technology", Retrieved from: <http://press.xtvworld.com/article3817.html> on May 8, 2012,(Jan. 6, 2005), 2 pages.

"Force and Position Sensing Resistors: An Emerging Technology", *Interlink Electronics*, Available at <http://staff.science.uva.nl/~vlaander/docu/FSR/An_Exploring_Technology.pdf>,(Feb. 1990), pp. 1-6.

"Frogpad Introduces Weareable Fabric Keyboard with Bluetooth Technology", Retrieved from: <http://www.geekzone.co.nz/content.asp?contentid=3898> on May 7, 2012,(Jan. 7, 2005), 3 pages.

"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.

"Membrane Keyboards & Membrane Keypads", Retrieved from: <http://www.pannam.com/> on May 9, 2012,(Mar. 4, 2009), 2 pages.

"Motion Sensors", *Android Developers*, retrieved from <http://developer.android.com/guide/topics/sensors/sensors_motion.html> on May 25, 2012, 7 pages.

"Position Sensors", *Android Developers*, retrieved from <http://developer.android.com/guide/topics/sensors/sensors_position.html> on May 25, 2012, 5 pages.

"SolRxTM E-Series Multidirectional Phototherapy ExpandableTM 2-Bulb Full Body Panel System", Retrieved from: <http://www.solarcsystems.com/us_multidirectional_uv_light_therapy_1_intro.html > on Jul. 25, 2012,(2011), 4 pages.

"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.

Block, Steve et al., "DeviceOrientation Event Specification", *W3C, Editors Draft*, retrieved from <https://developer.palm.com/content/api/dev-guide/pdk/accessing-device-sensors.html> on May 25, 2012,(Jul. 12, 2011), 14 pages.

Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.

Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012,(Oct. 19, 2008), 4 pages.

Crider, Michael "Sony Slate Concept Tablet "Grows" a Kickstand", Retrieved from: <http://androidcommunity.com/sony-slate-concept-tablet-grows-a-kickstand-20120116/> on May 4, 2012,(Jan. 16, 2012), 9 pages.

Dietz, Paul H., et al., "A Practical Pressure Sensitive Computer Keyboard", In Proceedings of UIST 2009,(Oct. 2009), 4 pages.

Glatt, Jeff "Channel and Key Pressure (Aftertouch).", Retrieved from: <http://home.roadrunnercom/~jgglatt/tutr/touch.htm> on Jun. 11, 2012, 2 pages.

Hanlon, Mike "ElekTex Smart Fabric Keyboard Goes Wireless", Retrieved from: <http://www.gizmag.com/go/5048/ > on May 7, 2012,(Jan. 15, 2006), 5 pages.

Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.

Khuntontong, Puttachat et al., "Fabrication of Molded Interconnection Devices By Ultrasonic Hot Embossing on Thin Polymer Films", IEEE Transactions on Electronics Packaging Manufacturing, vol. 32, No. 3,(Jul. 2009), pp. 152-156.

Linderholm, Owen "Logitech Shows Cloth Keyboard for PDAs", Retrieved from: <http://www.pcworld.com/article/89084/logitech_shows_cloth_keyboard_for_pdas.html> on May 7, 2012,(Mar. 15, 2002), 5 pages.

McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012,(Jul. 17, 2006), 9 pages.

Post, E.R. et al., "E-Broidery: Design and Fabrication of Textile-Based Computing", IBM Systems Journal, vol. 39, Issue 3 & 4,(Jul. 2000), pp. 840-860.

Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012), 15 pages.

Takamatsu, Seiichi et al., "Flexible Fabric Keyboard with Conductive Polymer-Coated Fibers", In Proceedings of Sensors 2011,(Oct. 28, 2011), 4 pages.

Zhang, et al., "Model-Based Development of Dynamically Adaptive Software", *In Proceedings of ICSE 2006*, Available at <http://www.irisa.fr/lande/lande/icse-proceedings/icse/p371.pdf>, (May 20, 2006), pp. 371-380.

"Cholesteric Liquid Crystal", Retrieved from: <http://en.wikipedia.org/wiki/Cholesteric_liquid_crystal> on Aug. 6, 2012,(Jun. 10, 2012), 2 pages.

"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, (Jan. 2013), 1 page.

"Corrected Notice of Allowance", U.S. Appl. No. 13/470,633, (Apr. 9, 2013), 2 pages.

"DR2PA", retrieved from <http://www.architainment.co.uk/wp-content/uploads/2012/08/DR2PA-AU-US-size-Data-Sheet-Rev-H_Logo.pdf> on Sep. 17, 2012, 4 pages.

"Final Office Action", U.S. Appl. No. 13/651,195, (Apr. 18, 2013), 13 pages.

"How to Use the iPad's Onscreen Keyboard", Retrieved from <http://www.dummies.com/how-to/content/how-to-use-the-ipads-onscreen-keyboard.html> on Aug. 28, 2012, 3 pages.

"i-Interactor electronic pen", Retrieved from: <http://www.alibaba.com/product-gs/331004878/i_Interactor_electronic_pen.html> on Jun. 19, 2012, 5 pages.

"MPG Fly Music Production Controller", *AKAI Professional*, Retrieved from: <http://www.akaiprompc.com/mpc-fly> on Jul. 9, 2012, 4 pages.

"NI Releases New Maschine & Maschine Mikro", Retrieved from <http://www.djbooth.net/index/dj-equipment/entry/ni-releases-new-maschine-mikro/> on Sep. 17, 2012, 19 pages.

"Non-Final Office Action", U.S. Appl. No. 13/471,001, (Feb. 19, 2013), 15 pages.

(56) References Cited

OTHER PUBLICATIONS

"Non-Final Office Action", U.S. Appl. No. 13/471,139, (Mar. 21, 2013), 12 pages.
"Non-Final Office Action", U.S. Appl. No. 13/471,202, (Feb. 11, 2013), 10 pages.
"Non-Final Office Action", U.S. Appl. No. 13/471,336, (Jan. 18, 2013), 14 pages.
"Non-Final Office Action", U.S. Appl. No. 13/651,195, (Jan. 2, 2013), 14 pages.
"Non-Final Office Action", U.S. Appl. No. 13/651,232, (Jan. 17, 2013), 15 pages.
"Non-Final Office Action", U.S. Appl. No. 13/651,272, (Feb. 12, 2013), 10 pages.
"Non-Final Office Action", U.S. Appl. No. 13/651,287, (Jan. 29, 2013), 13 pages.
"Non-Final Office Action", U.S. Appl. No. 13/651,304, (Mar. 22, 2013), 9 pages.
"Non-Final Office Action", U.S. Appl. No. 13/651,327, (Mar. 22, 2013), 6 pages.
"Non-Final Office Action", U.S. Appl. No. 13/651,726, (Apr. 15, 2013), 6 pages.
"Non-Final Office Action", U.S. Appl. No. 13/651,871, (Mar. 18, 2013), 14 pages.
"Non-Final Office Action", U.S. Appl. No. 13/653,321, (Feb. 1, 2013), 13 pages.
"Non-Final Office Action", U.S. Appl. No. 13/653,682, (Feb. 7, 2013), 11 pages.
"Non-Final Office Action", U.S. Appl. No. 13/656,055, (Apr. 23, 2013), 11 pages.
"Notice of Allowance", U.S. Appl. No. 13/470,633, (Mar. 22, 2013), 7 pages.
"On-Screen Keyboard for Windows 7, Vista, XP with Touchscreen", Retrieved from <www.comfort-software.com/on-screen-keyboard.html> on Aug. 28, 2012, (Feb. 2, 2011), 3 pages.
"Reflex LCD Writing Tablets", retrieved from <http://www.kentdisplays.com/products/lcdwritingtablets.html> on Jun. 27, 2012, 3 pages.
"Restriction Requirement", U.S. Appl. No. 13/471,139, (Jan. 17, 2013), 7 pages.
"Restriction Requirement", U.S. Appl. No. 13/651,304, (Jan. 18, 2013), 7 pages.
"Restriction Requirement", U.S. Appl. No. 13/651,726, (Feb. 22, 2013), 6 pages.
"Restriction Requirement", U.S. Appl. No. 13/651,871, (Feb. 7, 2013), 6 pages.
"SMART Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>,(2009), 2 pages.
"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, (Jun. 2012), 2 pages.
"Tilt Shift Lenses: Perspective Control", retrieved from http://www.cambridgeincolour.com/tutorials/tilt-shift-lenses1.htm, (Mar. 28, 2008), 11 Pages.
"What is Active Alignment?", http://www.kasalis.com/active_alignment.html, retrieved on Nov. 22, 2012, 2 Pages.
Das, Apurba et al., "Study of Heat Transfer through Multilayer Clothing Assemblies: A Theoretical Prediction", Retrieved from <http://www.autexrj.com/cms/zalaczone_pliki/5_013_11.pdf>, (Jun. 2011), 7 pages.
Piltch, Avram "ASUS Eee Pad Slider SL101 Review", Retrieved from <http://www.laptopmag.com/review/tablets/asus-eee-pad-slider-sl101.aspx>, (Sep. 22, 2011), 5 pages.
Qin, Yongqiang et al., "pPen: Enabling Authenticated Pen and Touch Interaction on Tabletop Surfaces", *In Proceedings of ITS 2010*, Available at <http://www.dfki.de/its2010/papers/pdf/po172.pdf>,(Nov. 2010), pp. 283-284.

Sumimoto, Mark "Touch & Write: Surface Computing With Touch and Pen Input", Retrieved from: <http://www.gottabemobile.com/2009/08/07/touch-write-surface-computing-with-touch-and-pen-input/> on Jun. 19, 2012,(Aug. 7, 2009), 4 pages.
Valliath, G T., "Design of Hologram for Brightness Enhancement in Color LCDs", Retrieved from <http://www.loreti.it/Download/PDF/LCD/44_05.pdf> on Sep. 17, 2012, 5 pages.
Williams, Jim "A Fourth Generation of LCD Backlight Technology", Retrieved from <http://cds.linear.com/docs/Application%20Note/an65f.pdf>, (Nov. 1995), 124 pages.
"Non-Final Office Action", U.S. Appl. No. 14/063,912, Jan. 2, 2014, 10 pages.
"FingerWorks Installation and Operation Guide for the TouchStream ST and TouchStream LP", FingerWorks, Inc. Retrieved from <http://ec1.images-amazon.com/media/i3d/01/A/man-migrate/MANUAL000049862.pdf>, 2002, 14 pages.
"Non-Final Office Action", U.S. Appl. No. 13/651,232, Dec. 5, 2013, 15 pages.
"Non-Final Office Action", U.S. Appl. No. 13/468,918, Dec. 26, 2013, 18 pages.
"Corrected Notice of Allowance", U.S. Appl. No. 13/563,435, Jan. 14, 2014, 2 pages.
"Corrected Notice of Allowance", U.S. Appl. No. 13/563,435, Jan. 22, 2014, 2 pages.
"Notice of Allowance", U.S. Appl. No. 13/653,321, Dec. 18, 2013, 4 pages.
"Foreign Office Action", CN Application No. 201320097066.8, Oct. 24, 2013, 5 Pages.
"Non-Final Office Action", U.S. Appl. No. 13/939,002, Dec. 20, 2013, 5 pages.
"Final Office Action", U.S. Appl. No. 13/939,032, Dec. 20, 2013, 5 pages.
"Restriction Requirement", U.S. Appl. No. 13/468,918, Nov. 29, 2013, 6 pages.
"Notice of Allowance", U.S. Appl. No. 13/565,124, Dec. 24, 2013, 6 pages.
"Final Office Action", U.S. Appl. No. 13/564,520, Jan. 15, 2014, 7 pages.
"Advisory Action", U.S. Appl. No. 13/939,032, Feb. 24, 2014, 2 pages.
"Non-Final Office Action", U.S. Appl. No. 13/599,635, Feb. 25, 2014, 13 pages.
"Non-Final Office Action", U.S. Appl. No. 13/471,186, Feb. 27, 2014, 8 pages.
"Non-Final Office Action", U.S. Appl. No. 13/471,405, Feb. 20, 2014, 37 pages.
"Non-Final Office Action", U.S. Appl. No. 13/564,520, Feb. 14, 2014, 5 pages.
"Non-Final Office Action", U.S. Appl. No. 13/653,682, Feb. 26, 2014, 10 pages.
"Non-Final Office Action", U.S. Appl. No. 13/656,055, Mar. 12, 2014, 17 pages.
"Notice of Allowance", U.S. Appl. No. 13/471,139, Mar. 17, 2014, 4 pages.
"Notice of Allowance", U.S. Appl. No. 13/938,930, Feb. 20, 2014, 4 pages.
"Notice of Allowance", U.S. Appl. No. 13/939,002, Mar. 3, 2014, 4 pages.
"Corrected Notice of Allowance", U.S. Appl. No. 13/470,633, (Jul. 2, 2013), 2 pages.
"Final Office Action", U.S. Appl. No. 13/651,232, (May 21, 2013), 21 pages.
"Final Office Action", U.S. Appl. No. 13/651,287, (May 03, 2013), 16 pages.
"Non-Final Office Action", U.S. Appl. No. 13/563,435, (Jun. 14, 2013), 6 pages.
"Non-Final Office Action", U.S. Appl. No. 13/564,520, (Jun. 19, 2013), 8 pages.
"Non-Final Office Action", U.S. Appl. No. 13/565,124, (Jun. 17, 2013), 5 pages.
"Non-Final Office Action", U.S. Appl. No. 13/651,871, (Jul. 1, 2013), 5 pages.

(56) References Cited

OTHER PUBLICATIONS

"Non-Final Office Action", U.S. Appl. No. 13/653,682, (Jun. 3, 2013),14 pages.
"Notice of Allowance", U.S. Appl. No. 13/471,202, (May 28, 2013), 7 pages.
"Notice of Allowance", U.S. Appl. No. 13/651,195, (Jul. 8, 2013), 9 pages.
"Notice of Allowance", U.S. Appl. No. 13/651,272, (May 2, 2013), 7 pages.
"Notice of Allowance", U.S. Appl. No. 13/651,304, (Jul. 1, 2013), 5 pages.
"Notice of Allowance", U.S. Appl. No. 13/651,327, (Jun. 11, 2013), 7 pages.
"Notice of Allowance", U.S. Appl. No. 13/651,726, (May 31, 2013), 5 pages.
"Final Office Action", U.S. Appl. No. 13/471,001, (Jul. 25, 2013), 20 pages.
"Final Office Action", U.S. Appl. No. 13/471,336, (Aug. 28, 2013),18 pages.
"Final Office Action", U.S. Appl. No. 13/653,321, (Aug. 2, 2013),17 pages.
"Non-Final Office Action", U.S. Appl. No. 13/527,263, (Jul. 19, 2013), 5 pages.
"Non-Final Office Action", U.S. Appl. No. 13/656,520, (Jun. 5, 2013), 8 pages.
"Non-Final Office Action", U.S. Appl. No. 13/938,930, (Aug. 29, 2013), 9 pages.
"Non-Final Office Action", U.S. Appl. No. 13/939,002, (Aug. 28, 2013), 6 pages.
"Non-Final Office Action", U.S. Appl. No. 13/939,032, (Aug. 29, 2013), 7 pages.
"PCT Search Report and Written Opinion", Application No. PCT/US2013/029461, (Jun. 21, 2013), 11 pages.
"PCT Search Report and Written Opinion", Application No. PCT/US2013/028948, (Jun. 21, 2013), 11 pages.
"Advanced Configuration and Power Management Specification", *Intel Corporation, Microsoft Corporation, Toshiba Corp. Revision 1*, (Dec. 22, 1996), 364 pages.
"Final Office Action", U.S. Appl. No. 13/656,055, (Oct. 23, 2013), 14 pages.
"Final Office Action", U.S. Appl. No. 13/938,930, (Nov. 8, 2013), 10 pages.
"Final Office Action", U.S. Appl. No. 13/939,002, (Nov. 8, 2013), 7 pages.
"International Search Report and Written Opinion", Application No. PCT/US2013/040968, (Sep. 5, 2013), 12 pages.
"International Search Report and Written Opinion", Application No. PCT/US2013/045049, (Sep. 16, 2013), 9 pages.
"International Search Report and Written Opinion", Application No. PCT/US2013/042550, (Sep. 24, 2013), 14 pages.
"Non-Final Office Action", U.S. Appl. No. 13/780,228, (Oct. 30, 2013), 12 pages.
"Notice of Allowance", U.S. Appl. No. 13/563,435, (Nov. 12, 2013), 5 pages.
"Notice to Grant", CN Application No. 201320097124.7, (Oct. 8, 2013), 2 pages.
"Welcome to Windows 7", Retrieved from: <http://www.microsoft.com/en-us/download/confirmation.aspx?id=4984> on Aug. 1, 2013, (Sep. 16, 2009), 3 pages.
Prospero, Michael "Samsung Outs Series 5 Hybrid PC Tablet", Retrieved from: <http://blog.laptopmag.com/samsung-outs-series-5-hybrid-pc-tablet-running-windows-8> on Oct. 31, 2013, (Jun. 4, 2012), 7 pages.
Gaver, et al.,"A Virtual Window on Media Space", retrieved from <http://www.gold.ac.uk/media/15gaver-smets-overbeeke.MediaSpaceWindow.chi95.pdf> on Jun. 1, 2012,retrieved from <http://www.gold.ac.uk/media/15gaver-smets-overbeeke.MediaSpaceWindow.chi95.pdf> on Jun. 1, 2012, May 7, 1995, 9 pages.

Li, et al.,"Characteristic Mode Based Tradeoff Analysis of Antenna-Chassis Interactions for Multiple Antenna Terminals", In IEEE Transactions on Antennas and Propagation, Retrieved from <http://ieeexplore.ieee.org/stamp/stamp.jsp?tp=&arnumber=6060882>, Feb. 2012, 13 pages.
Hinckley, et al.,"Codex: A Dual Screen Tablet Computer", Conference on Human Factors in Computing Systems, Apr. 9, 2009, 10 pages.
Adrian, et al.,"Collimated Light from a Waveguide for a Display Backlight", Optics Express, 19714, vol. 17, No. 22,retrieved from <http://download.microsoft.com/download/D/2/E/D2E425F8-CF3C-4C71-A4A2- 70F9D4081007/OpticsExpressbacklightpaper.pdf> on Oct. 15, 2009, Oct. 15, 2009, 6 pages.
"Corrected Notice of Allowance", U.S. Appl. No. 13/651,327, Sep. 12, 2013, 2 pages.
"Corrected Notice of Allowance", U.S. Appl. No. 13/651,726, Sep. 17, 2013, 2 pages.
"Corrected Notice of Allowance", U.S. Appl. No. 13/651,327, Sep. 23, 2013, 2 pages.
"Developing Next-Generation Human Interfaces using Capacitive and Infrared Proximity Sensing", Silicon Laboratories, Inc., Available at <http://www.silabs.com/pages/DownloadDoc.aspx?FILEURL=support%20documents/technicaldocs/capacitive%20and%20proximity%20sensing_wp.pdf&src=SearchResults>, Aug. 30, 2010, pp. 1-10.
"Directional Backlighting for Display Panels", U.S. Appl. No. 13/021,448, filed Feb. 4, 2011, 38 pages.
Reilink, et al.,"Endoscopic Camera Control by Head Movements for Thoracic Surgery", In Proceedings of 3rd IEEE RAS & EMBS International Conference of Biomedical Robotics and Biomechatronics, retrieved from <http://doc.utwente.nl/74929/1/biorob_online.pdf> on Jun. 1, 2012, Sep. 26, 2010, pp. 510-515.
Manresa-Yee, et al.,"Experiences Using a Hands-Free Interface", In Proceedings of the 10th International ACM SIGACESS Conference on Computers and Accessibility, retrieved from <http://dmi.uib.es/~cmanresay/Research/%5BMan08%5DAssets08.pdf> on Jun. 1, 2012, Oct. 13, 2008, pp. 261-262.
"Final Office Action", U.S. Appl. No. 13/471,139, Sep. 16, 2013, 13 pages.
"Final Office Action", U.S. Appl. No. 13/653,682, Oct. 18, 2013, 16 pages.
Sundstedt, "Gazing at Games: Using Eye Tracking to Control Virtual Characters", In ACM SIGGRAPH 2010 Courses, retrieved from <http://www.tobii.com/Global/Analysis/Training/EyeTrackAwards/veronica_sundstedt.pdf> on Jun. 1, 2012, Jul. 28, 2010, 85 pages.
Xu, et al.,"Hand Gesture Recognition and Virtual Game Control Based on 3D Accelerometer and EMG Sensors", IUI'09, Feb. 8-11, 2009,retrieved from <http://sclab.yonsei.ac.kr/courses/10TPR/10TPR.files/Hand%20Gesture%20Recognition%20and%20Virtual%20Game%20Control%20based%20on%203d%20accelerometer%20and%20EMG%20sensors.pdf> on Jan. 5, 2012, Feb. 8, 2009, 5 pages.
Kaufmnn, et al.,"Hand Posture Recognition Using Real-time Artificial Evolution", EvoApplications'09,retrieved from <http://evelyne.lutton.free.fr/Papers/KaufmannEvolASP2010.pdf> on Jan. 5, 2012, Apr. 3, 2010, 10 pages.
Zhu, et al.,"Keyboard before Head Tracking Depresses User Success in Remote Camera Control", In Proceedings of 12th IFIP TC 13 International Conference on Human-Computer Interaction, Part II,retrieved from <http://csiro.academia.edu/Departments/CSIRO_ICT_Centre/Papers?page=5> on Jun. 1, 2012, Aug. 24, 2009, 14 pages.
Nakanishi, et al.,"Movable Cameras Enhance Social Telepresence in Media Spaces", In Proceedings of the 27th International Conference on Human Factors in Computing Systems,retrieved from <http://smg.ams.eng.osaka-u.ac.jp/~nakanishi/hnp_2009_chi.pdf> on Jun. 1, 2012, Apr. 6, 2009, 10 pages.
Iwase "Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> Proceedings: Journal of Microelectromechanical Systems, Dec. 2005, 7 pages.
"Non-Final Office Action", U.S. Appl. No. 13/656,520, Feb. 1, 2013, 15 pages.

(56) References Cited

OTHER PUBLICATIONS

"Non-Final Office Action", U.S. Appl. No. 13/021,448, Dec. 13, 2012, 9 pages.
Valli "Notes on Natural Interaction", retrieved from <http://www.idemployee.id.tue.nl/g.w.m.rauterberg/lecturenotes/valli-2004.pdf> on Jan. 5, 2012, Sep. 2005, 80 pages.
"Notice of Allowance", U.S. Appl. No. 13/651,871, Oct. 2, 2013, 7 pages.
"Notice to Grant", Chinese Application No. 201320097089.9, Sep. 29, 2013, 2 Pages.
"Optical Sensors in Smart Mobile Devices", On Semiconductor, TND415/D,Available at <http://www.onsemi.jp/pub_link/Collateral/TND415-D.PDF>, Nov. 2010, pp. 1-13.
"Optics for Displays: Waveguide-based Wedge Creates Collimated Display Backlight", OptoIQ, retrieved from <http://www.optoiq.com/index/photonics-technologies-applications/lfw-display/lfw-article-display.articles.laser-focus-world.volume-46.issue-1.world-news.optics-for_displays.html> on Nov. 2, 2010, Jan. 1, 2010, 3 pages.
Vaucelle "Scopemate, A Robotic Microscope!", Architectradure, retrieved from <http://architectradure.blogspot.com/2011/10/at-uist-this-monday-scopemate-robotic.html> on Jun. 6, 2012, Oct. 17, 2011, 2 pages.
Travis, et al.,"The Design of Backlights for View-Sequential 3D", retrieved from <http://download.microsoft.com/download/D/2/E/D2E425F8-CF3C-4C71-A4A2-70F9D4081007/Backlightforviewsequentialautostereo.docx> on Nov. 1, 2010, 4 pages.
Xu, et al.,"Vision-based Detection of Dynamic Gesture", ICTM'09, Dec. 5-6, 2009,retrieved from <http://ieeexplore.ieee.org/stamp/stamp.jsp?tp=&arnumber=5412956> on Jan. 5, 2012, Dec. 5, 2009, pp. 223-226.
Harada, et al.,"VoiceDraw: A Hands-Free Voice-Driven Drawing Application for People With Motor Impairments", In Proceedings of Ninth International ACM SIGACCESS Conference on Computers and Accessibility, retrieved from <http://citeseerx.ist.psu.edu/viewdoc/download?doi=10.1.1.113.7211&rep=rep1&type=pdf> on Jun. 1, 2012, Oct. 15, 2007, 8 pages.
"Corrected Notice of Allowance", U.S. Appl. No. 13/563,435, Mar. 20, 2014, 2 pages.
"Corrected Notice of Allowance", U.S. Appl. No. 13/565,124, Apr. 3, 2014, 4 pages.
"Corrected Notice of Allowance", U.S. Appl. No. 13/565,124, Mar. 10, 2014, 2 pages.
"Corrected Notice of Allowance", U.S. Appl. No. 13/565,124, Apr. 14, 2014, 2 pages.
"Corrected Notice of Allowance", U.S. Appl. No. 13/938,930, May 6, 2014, 2 pages.
"Corrected Notice of Allowance", U.S. Appl. No. 13/939,002, May 5, 2014, 2 pages.
"Final Office Action", U.S. Appl. No. 13/780,228, Mar. 28, 2014, 13 pages.
"Final Office Action", U.S. Appl. No. 14/063,912, Apr. 29, 2014, 10 pages.
"Final Office Action", U.S. Appl. No. 14/199,924, May 6, 2014, 5 pages.
"Foreign Office Action", CN Application No. 201320328022.1, Feb. 17, 2014, 4 Pages.
"Foreign Office Action", CN Application No. 201320328022.1, Oct. 18, 2013, 3 Pages.
"Non-Final Office Action", U.S. Appl. No. 13/471,237, Mar. 24, 2014, 7 pages.
"Non-Final Office Action", U.S. Appl. No. 13/471,336, May 7, 2014, 17 pages.
"Non-Final Office Action", U.S. Appl. No. 13/471,376, Apr. 2, 2014, 17 pages.
"Non-Final Office Action", U.S. Appl. No. 13/492,232, Apr. 30, 2014, 9 pages.
"Non-Final Office Action", U.S. Appl. No. 13/527,263, Apr. 3, 2014, 6 pages.
"Non-Final Office Action", U.S. Appl. No. 14/199,924, Apr. 10, 2014, 6 pages.
"Non-Final Office Action", U.S. Appl. No. 14/200,595, Apr. 11, 2014, 4 pages.
"Notice of Allowance", U.S. Appl. No. 13/651,232, Apr. 25, 2014, 9 pages.
"Notice of Allowance", U.S. Appl. No. 13/651,287, May 2, 2014, 6 pages.
"Notice of Allowance", U.S. Appl. No. 13/939,032, Apr. 3, 2014, 4 pages.
"Supplemental Notice of Allowance", U.S. Appl. No. 13/653,321, Mar. 28, 2014, 4 pages.
"Final Office Action", U.S. Appl. No. 13/471,412, Dec. 15, 2014, 11 pages.
"Final Office Action", U.S. Appl. No. 13/647,479, Dec. 12, 2014, 12 pages.
"Final Office Action", U.S. Appl. No. 14/225,276, Dec. 17, 2014, 6 pages.
"Foreign Office Action", CN Application No. 201320097079.5, Jul. 28, 2014, 4 pages.
"Supplemental Notice of Allowance", U.S. Appl. No. 13/471,405, Dec. 17, 2014, 5 pages.
"Advisory Action", U.S. Appl. No. 14/199,924, May 28, 2014, 2 pages.
"Corrected Notice of Allowance", U.S. Appl. No. 13/651,232, Jul. 31, 2014, 2 pages.
"Corrected Notice of Allowance", U.S. Appl. No. 13/651,287, Aug. 21, 2014, 2 pages.
"Corrected Notice of Allowance", U.S. Appl. No. 13/938,930, Jun. 6, 2014, 2 pages.
"Corrected Notice of Allowance", U.S. Appl. No. 13/939,002, May 22, 2014, 2 pages.
"Corrected Notice of Allowance", U.S. Appl. No. 13/939,002, Jun. 19, 2014, 2 pages.
"Corrected Notice of Allowance", U.S. Appl. No. 13/939,032, Jun. 26, 2014, 2 pages.
"Corrected Notice of Allowance", U.S. Appl. No. 13/939,032, Jul. 15, 2014, 2 pages.
"Corrected Notice of Allowance", U.S. Appl. No. 14/199,924, Aug. 29, 2014, 2 pages.
"Corrected Notice of Allowance", U.S. Appl. No. 14/199,924, Sep. 5, 2014, 2 pages.
"Final Office Action", U.S. Appl. No. 13/471,376, Aug. 18, 2014, 24 pages.
"Final Office Action", U.S. Appl. No. 13/595,700, Aug. 15, 2014, 6 pages.
"Final Office Action", U.S. Appl. No. 13/599,635, Aug. 8, 2014, 16 pages.
"Final Office Action", U.S. Appl. No. 13/653,682, Jun. 11, 2014, 11 pages.
"Foreign Notice of Allowance", CN Application No. 201320096755.7, Jan. 27, 2014, 2 pages.
"Foreign Notice of Allowance", CN Application No. 201320097065.3, Nov. 21, 2013, 2 pages.
"Foreign Office Action", CN Application No. 201320097065.3, Jun. 18, 2013, 2 pages.
"Foreign Office Action", CN Application No. 201320097079.5, Sep. 26, 2013, 4 pages.
"Interlink Electronics FSR (TM) Force Sensing Resistors (TM)", Retrieved at <<http://akizukidenshi.com/download/ds/interlinkelec/94-00004+Rev+B%20FSR%20Integration%20Guide.pdf on Mar. 21, 2013, 36 pages.
"International Search Report and Written Opinion", Application No. PCT/US2014/031531, Jun. 20, 2014, 10 Pages.
"International Search Report and Written Opinion", Application No. PCT/US2013/028483, Jun. 24, 2014, 10 pages.
"International Search Report and Written Opinion", Application No. PCT/US2013/028484, Jun. 24, 2014, 10 pages.
"International Search Report and Written Opinion", Application No. PCT/US2013/028485, Jun. 25, 2014, 10 pages.
"International Search Report and Written Opinion", Application No. PCT/US2013/028769, Jun. 26, 2014, 10 pages.

(56) References Cited

OTHER PUBLICATIONS

"International Search Report and Written Opinion", Application No. PCT/US2013/028771, Jun. 19, 2014, 10 pages.
"International Search Report and Written Opinion", Application No. PCT/US2013/028486, Jun. 20, 2014, 10 pages.
"International Search Report and Written Opinion", Application No. PCT/US2013/041017, Jul. 17, 2014, 10 pages.
"International Search Report and Written Opinion", Application No. PCT/US2013/028489, Jun. 20, 2014, 11 pages.
"International Search Report and Written Opinion", Application No. PCT/US2013/028488, Jun. 24, 2014, 11 pages.
"International Search Report and Written Opinion", Application No. PCT/US2013/028767, Jun. 24, 2014, 11 pages.
"International Search Report and Written Opinion", Application No. PCT/US2013/028481, Jun. 19, 2014, 11 pages.
"International Search Report and Written Opinion", Application No. PCT/US2013/028490, Jun. 24, 2014, 11 pages.
"International Search Report and Written Opinion", Application No. PCT/US2013/028766, Jun. 26, 2014, 11 pages.
"International Search Report and Written Opinion", Application No. PCT/US2013/028772, Jun. 30, 2014, 11 pages.
"International Search Report and Written Opinion", Application No. PCT/US2013/028768, Jun. 24, 2014, 12 pages.
"International Search Report and Written Opinion", Application No. PCT/US2013/028482, Jun. 20, 2014, 13 pages.
"International Search Report and Written Opinion", Application No. PCT/US2013/028487, May 27, 2014, 9 pages.
"International Search Report and Written Opinion", Application No. PCT/US2013/028770, Jun. 26, 2014, 9 pages.
"Non-Final Office Action", U.S. Appl. No. 13/468,882, Jul. 9, 2014, 9 pages.
"Non-Final Office Action", U.S. Appl. No. 13/468,949, Jun. 20, 2014, 10 pages.
"Non-Final Office Action", U.S. Appl. No. 13/470,951, Jul. 2, 2014, 19 pages.
"Non-Final Office Action", U.S. Appl. No. 13/471,001, Jun. 17, 2014, 23 pages.
"Non-Final Office Action", U.S. Appl. No. 13/471,030, May 15, 2014, 10 pages.
"Non-Final Office Action", U.S. Appl. No. 13/471,054, Jun. 3, 2014, 15 pages.
"Non-Final Office Action", U.S. Appl. No. 13/471,282, Sep. 3, 2014, 13 pages.
"Non-Final Office Action", U.S. Appl. No. 13/471,412, Jul. 11, 2014, 22 pages.
"Non-Final Office Action", U.S. Appl. No. 13/564,520, Jun. 16, 2014, 5 pages.
"Non-Final Office Action", U.S. Appl. No. 13/595,700, Jun. 18, 2014, 8 pages.
"Non-Final Office Action", U.S. Appl. No. 13/647,479, Jul. 3, 2014, 10 pages.
"Non-Final Office Action", U.S. Appl. No. 14/063,912, Sep. 2, 2014, 11 pages.
"Non-Final Office Action", U.S. Appl. No. 14/225,250, Jun. 17, 2014, 5 pages.
"Non-Final Office Action", U.S. Appl. No. 14/225,276, Jun. 13, 2014, 6 pages.
"Non-Final Office Action", U.S. Appl. No. 14/277,240, Jun. 13, 2014, 6 pages.
"Notice of Allowance", U.S. Appl. No. 13/468,918, Jun. 17, 2014, 5 pages.
"Notice of Allowance", U.S. Appl. No. 13/471,030, Sep. 5, 2014, 6 pages.
"Notice of Allowance", U.S. Appl. No. 13/471,186, Jul. 3, 2014, 7 pages.
"Notice of Allowance", U.S. Appl. No. 13/471,237, May 12, 2014, 8 pages.
"Notice of Allowance", U.S. Appl. No. 13/471,405, Jun. 24, 2014, 9 pages.
"Notice of Allowance", U.S. Appl. No. 14/018,286, May 23, 2014, 8 pages.
"Notice of Allowance", U.S. Appl. No. 14/199,924, Jun. 10, 2014, 4 pages.
"Notice of Allowance", U.S. Appl. No. 14/277,240, Sep. 16, 2014, 4 pages.
"Restriction Requirement", U.S. Appl. No. 13/595,700, May 28, 2014, 6 pages.
"Restriction Requirement", U.S. Appl. No. 13/653,184, Sep. 5, 2014, 6 pages.
"Supplemental Notice of Allowance", U.S. Appl. No. 13/471,405, Aug. 29, 2014, 5 pages.
"Supplemental Notice of Allowance", U.S. Appl. No. 14/018,286, Jun. 11, 2014, 5 pages.
"Corrected Notice of Allowance", U.S. Appl. No. 13/471,030, Sep. 30, 2014, 2 pages.
"Corrected Notice of Allowance", U.S. Appl. No. 14/199,924, Sep. 19, 2014, 2 page.
"Final Office Action", U.S. Appl. No. 13/468,949, Oct. 6, 2014, 11 pages.
"Final Office Action", U.S. Appl. No. 13/471,054, Oct. 23, 2014, 17 pages.
"Final Office Action", U.S. Appl. No. 13/471,336, Oct. 6, 2014, 13 pages.
"Final Office Action", U.S. Appl. No. 13/492,232, Nov. 17, 2014, 13 pages.
"Final Office Action", U.S. Appl. No. 13/595,700, Oct. 9, 2014, 8 pages.
"Final Office Action", U.S. Appl. No. 13/656,055, Sep. 17, 2014, 10 pages.
"Final Office Action", U.S. Appl. No. 14/200,595, Nov. 19, 2014, 5 pages.
"International Search Report and Written Opinion", Application No. PCT/US2014/043546, Oct. 9, 2014, 10 pages.
"Non-Final Office Action", U.S. Appl. No. 13/471,393, Oct. 20, 2014, 12 pages.
"Non-Final Office Action", U.S. Appl. No. 13/525,614, Nov. 24, 2014, 19 pages.
"Non-Final Office Action", U.S. Appl. No. 13/653,184, Dec. 1, 2014, 7 pages.
"Non-Final Office Action", U.S. Appl. No. 13/780,228, Sep. 15, 2014, 18 pages.
"Notice of Allowance", U.S. Appl. No. 13/653,682, Sep. 24, 2014, 4 pages.
"Restriction Requirement", U.S. Appl. No. 13/653,218, Nov. 7, 2014, 6 pages.
"Restriction Requirement", U.S. Appl. No. 14/147,252, Dec. 1, 2014, 6 pages.
Harrison, "UIST 2009 Student Innovation Contest—Demo Video", Retrieved From: <https://www.youtube.com/watch?v=PD18eYIASf0> Sep. 16, 2014, Jul. 23, 2009, 1 pages.
"Corrected Notice of Allowance", U.S. Appl. No. 14/227,240, Jan. 8, 2015, 2 pages.
"Final Office Action", U.S. Appl. No. 13/468,882, Feb. 12, 2015, 9 pages.
"Final Office Action", U.S. Appl. No. 13/470,951, Jan. 12, 2015, 20 pages.
"Final Office Action", U.S. Appl. No. 14/063,912, Jan. 12, 2015, 12 pages.
"First Examination Report", NZ Application No. 628690, Nov. 27, 2014, 2 pages.
"Non-Final Office Action", U.S. Appl. No. 13/471,030, Jan. 15, 2015, 7 pages.
"Non-Final Office Action", U.S. Appl. No. 14/147,252, Feb. 23, 2015, 11 pages.
"Non-Final Office Action", U.S. Appl. No. 13/492,232, Feb. 24, 2015, 12 pages.
"Non-Final Office Action", U.S. Appl. No. 13/564,520, Jan. 26, 2015, 6 pages.
"Non-Final Office Action", U.S. Appl. No. 13/599,635, Feb. 12, 2015, 16 pages.
"Notice of Allowance", U.S. Appl. No. 13/595,700, Jan. 21, 2015, 4 pages.

(56) References Cited

OTHER PUBLICATIONS

"Notice of Allowance", U.S. Appl. No. 14/200,595, Feb. 17, 2015, 2 pages.

"Notice of Allowance", U.S. Appl. No. 14/200,595, Feb. 25, 2015, 4 pages.

"Final Office Action", U.S. Appl. No. 14/225,250, Mar. 13, 2015, 7 pages.

"Non-Final Office Action", U.S. Appl. No. 13/471,054, Mar. 13, 2015, 18 pages.

"Non-Final Office Action", U.S. Appl. No. 13/471,393, Mar. 26, 2015, 13 pages.

"Non-Final Office Action", U.S. Appl. No. 13/653,218, Mar. 4, 2015, 16 pages.

"Non-Final Office Action", U.S. Appl. No. 13/852,848, Mar. 26, 2015, 7 pages.

"Non-Final Office Action", U.S. Appl. No. 14/059,280, Mar. 3, 2015, 18 pages.

"Notice of Allowance", U.S. Appl. No. 13/653,184, Mar. 10, 2015, 6 pages.

"Notice of Allowance", U.S. Appl. No. 13/656,055, Mar. 4, 2015, 7 pages.

"International Search Report and Written Opinion", Application No. PCT/US2014/013928, Oct. 22, 2014, 13 Pages.

"International Search Report and Written Opinion", Application No. PCT/US2014/013928, May 12, 2014, 17 pages.

"Corrected Notice of Allowance", U.S. Appl. No. 13/656,055, Apr. 13, 2015, 2 pages.

"Final Office Action", U.S. Appl. No. 13/780,228, Apr. 10, 2015, 19 pages.

"Foreign Notice on Reexamination", CN Application No. 201320097066.8, Apr. 3, 2015, 7 Pages.

"Non-Final Office Action", U.S. Appl. No. 13/471,376, Mar. 27, 2015, 28 pages.

"Notice of Allowance", U.S. Appl. No. 13/468,918, Apr. 8, 2015, 7 pages.

"Notice of Allowance", U.S. Appl. No. 13/471,030, Apr. 6, 2015, 6 pages.

"Notice of Allowance", U.S. Appl. No. 13/651,232, Mar. 30, 2015, 7 pages.

"Supplemental Notice of Allowance", U.S. Appl. No. 13/595,700, Apr. 10, 2015, 2 pages.

"Using Interactive Maps for Navigation and Collaboration", CHI '01 Extended Abstracts on Human Factors in Computing Systems, Mar. 31, 2001, 2 pages.

\* cited by examiner

MOBILE DEVICE POWER STATE

RELATED APPLICATIONS

This application is a continuation of and claims priority to U.S. patent application Ser. No. 13/471,001, filed May 14, 2012, entitled "Mobile Device Power State" and further claims priority under 35 U.S.C. §119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on.

Because mobile computing devices are configured to be mobile, the devices typically include some type of battery that serves as a mobile source of power for the devices. A limitation associated with utilizing battery power is that a battery has a limited effective charge life. When a battery charge for a mobile computing device is depleted, the battery is recharged or replaced in order to maintain operability of the device. Thus, to extend battery usage life, managing power consumption of mobile computing devices is an important consideration.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Techniques for mobile device power state are described. In one or more implementations, a mobile device includes a computing device that is flexibly coupled to an input device via a flexible hinge. Accordingly, the mobile device can operate in a variety of different power states based on a positional orientation of the computing device to an associated input device. For example, the computing device and the input device can be positioned at different respective tilt angles. Techniques can determine a tilt angle between the computing device and the input device, and can determine a particular power state for the computing device and/or the input device based on the tilt angle. For example, different tilt angle ranges can correspond to different power states.

In one or more implementations, an application that resides on a computing device can operate in different application states based on a positional orientation of the computing device to an associated input device. For example, a particular functionality of an application can be enabled or disabled based on a tilt angle between the computing device and the input device. Thus, different tilt angle ranges can correspond to different application states.

In one or more implementations, techniques can cause a computing device to transition between power states in response to detected vibrations. For example, a vibration detection mechanism (e.g., an accelerometer) associated with a computing device in a low power mode can detect vibration of the computing device and/or of an input device coupled to the computing device. The vibration, for instance, may be caused by user input to a touch functionality of the computing device, such as a touch screen of the computing device, a track pad of a coupled input device, and so on. Alternatively, the vibration can be caused by some other contact with the computing device, such as a result of inadvertent bumping of the computing device by a user, vibration of a table or other surface on which the computing device is resting, and so on. Thus, techniques discussed herein can differentiate between vibrations caused by touch input to a touch functionality, and other types of vibrations. Based on this differentiation, techniques can determine whether to transition between device power states.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Figure 1:
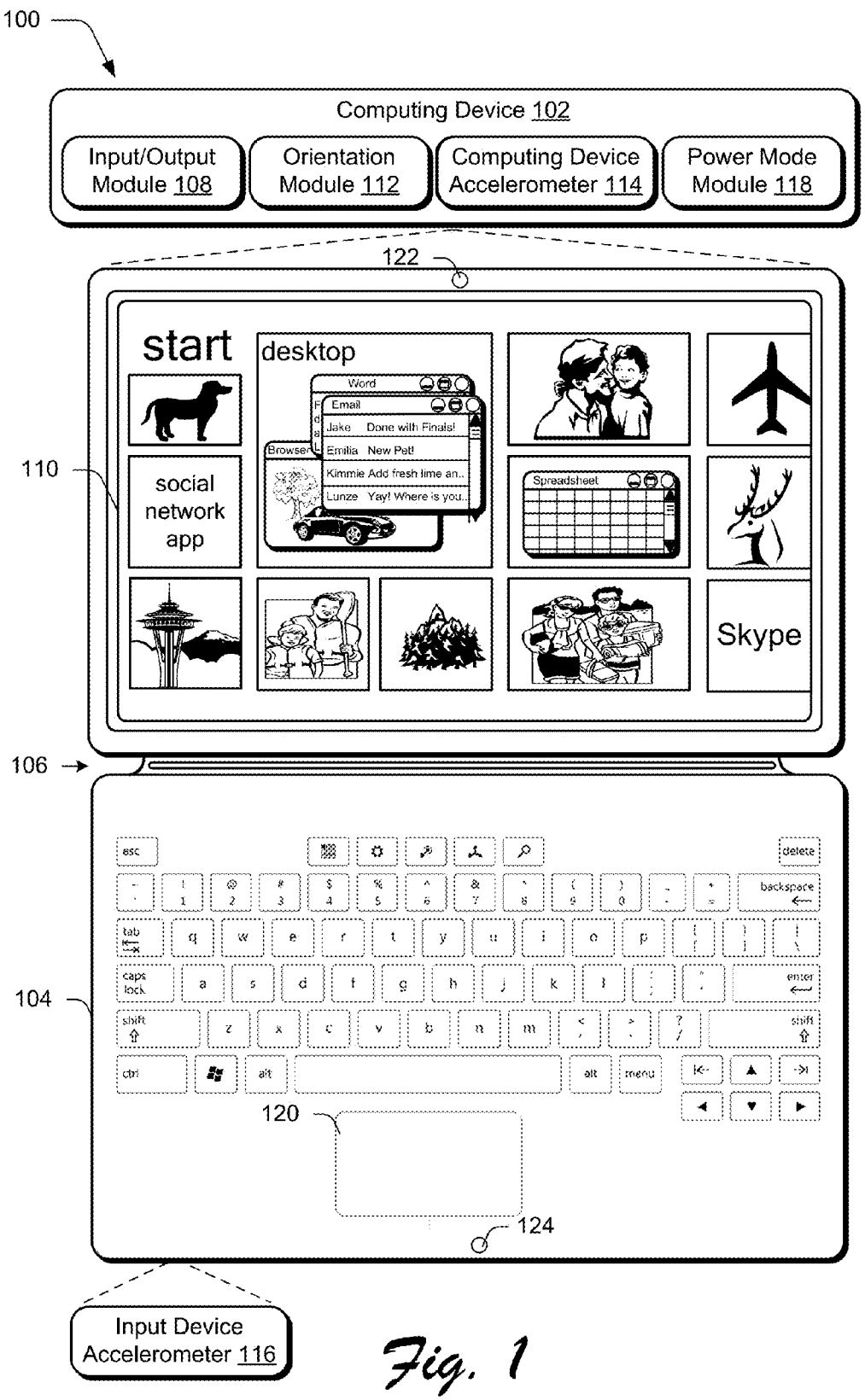
FIG. 1 is an illustration of an environment in an example implementation that is operable to employ the techniques described herein.

Techniques for mobile device power state are described. In one or more implementations, a mobile device includes a computing device that is flexibly coupled to an input device via a flexible hinge. Examples of an input device include a keyboard, a touch pad, combinations of a keyboard and touch pad, and so on. The computing device includes a display device (e.g., a display surface) and has independent operability separate from the input device, such as for outputting content, receiving touch input, and so on. The input device thus provides a mechanism for providing input to the computing device, but the computing device is also operable to provide functionality independent of the input device.

In one or more implementations, a computing device can operate in a variety of different power states based on a positional orientation of the computing device to an associated input device. For example, the computing device and the input device can be positioned at different respective tilt angles. Techniques can determine a tilt angle between the computing device and the input device, and can determine a particular power state for the computing device and/or the input device based on the tilt angle. For example, different tilt angle ranges can correspond to different device power states.

In one or more implementations, an application that resides on a computing device can operate in different application states based on a positional orientation of the computing device to an associated input device. For example, a particular functionality of an application can be enabled or disabled based on a tilt angle between the computing device and the input device. Thus, different tilt angle ranges can correspond to different application states.

In one or more implementations, techniques can cause a computing device to transition between power states in response to detected vibrations. For example, a vibration detection mechanism (e.g., an accelerometer) associated with a computing device in a low power mode can detect vibration of the computing device and/or of an input device coupled to the computing device. The vibration, for instance, may be caused by user input to a touch functionality associated with the computing device, such as a touch screen of the computing device, a track pad of a coupled input device, and so on. Alternatively, the vibration can be caused by some other contact with the computing device, such as a result of inadvertent bumping of the computing device by a user, vibration of a table or other surface on which the computing device is resting, and so on.

In response to the detected vibration, techniques can query a functionality of the computing device to determine whether the vibration was caused by touch input from a user. For example, a capacitive touch input mechanism (e.g., a track pad, a touch screen, and so forth) can be powered on and queried to determine whether the mechanism is receiving touch input from a user. Touch input, for instance, can indicate intent from a user to cause the computing device to transition from a low power (e.g., sleep) mode, to a functional mode.

If the mechanism indicates that it is receiving touch input, the computing device can wake from the low power mode. Absent an indication of touch input, the computing device can remain in a low power state. Thus, techniques can utilize a sensing mechanism that consumes less power to detect vibration of a computing device, and can utilize a mechanism that consumes more power (e.g., a capacitive touch sensor) to ascertain whether the vibration resulted from touch input. This can enable a sensing mechanism that consumes more power to remain in a low power state (e.g., an off state) unless queried to confirm the presence of touch input, thus reducing power consumption by a computing device.

In the following discussion, an example environment is first described that may employ techniques described herein. Next, a section entitled "Example Device Orientations" describes some example mobile device orientations in accordance with one or more embodiments. Following this, example procedures are described which may be performed in the example environment as well as other environments. Consequently, performance of the example procedures is not limited to the example environment and the example environment is not limited to performance of the example procedures. Next, a section entitled "Touch Initiated Power State Transition" describes example embodiments for transitioning between power states based on touch input. Finally, an example system and device are described in which embodiments may be implemented in accordance with one or more embodiments. Further, although an input device is described, other devices are also contemplated that do not include input functionality, such as covers.

Example Environment

FIG. 1 is an illustration of an environment 100 in an example implementation that is operable to employ techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by a display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as having an input portion that includes a keyboard having a QWERTY arrangement of keys and track pad although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one or more directions (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 may be configured in a variety of ways, further discussion of which may be found in relation to the figures discussed below.

The computing device 102 further includes an orientation module 112, which is representative of functionality to determine a positional orientation of the computing device 102 relative to the input device 104. For example, the orientation module 112 can receive orientation information from a computing device accelerometer 114, and from an input device accelerometer 116. The orientation module 112 can utilize the orientation information from the respective accelerometers to determine a relative orientation of the devices. The relative orientation, for instance, can indicate an angle at which the computing device 102 (e.g., the display device 110) is tilted with reference to the input device 104. Orientation information can be leveraged to perform various tasks, such as determining an appropriate power state for the computing device 102 and/or the input device 104, determining application states for various applications, and so on.

A power state module 118 is included, which is representative of functionality to cause the computing device 102 and/or the input device 104 to operate in various power states. For example, based on different device orientations determined by the orientation module 112, the power state module 118 can power on, power off, and hibernate the computing device 102 and/or the input device 104. A variety of other power states are contemplated as well. Different tilt angle ranges, for instance, can be associated with different power states for the computing device 102 and/or the input device 104.

The power state module 118 may also be employed to cause the computing device 102 and/or the input device 104 to transition between power states based on detected vibration, such as detected via the computing device accelerometer 114 and/or the input device accelerometer 116. Such vibration can be caused by user contact with the computing device 102 and/or the input device 104. For example, a user can touch the display device 110 and/or a track pad 120 to initiate waking the computing device 102 and/or the input device 104 from a sleep mode. Vibration may also be caused by other forms of contact, such as a user bumping the device and/or a surface on which the device is situated. As discussed in detail below, techniques can be implemented to differentiate between wake events (e.g., a user touching a key and/or the track pad 120), and non-wake events, such as incidental contact with a device.

As referenced above, the computing device 102 can be rotated to assume different orientations with respect to the input device 104. For instance, the computing device 102 can be rotated to a closed position, where the input device 104 covers the display device 110. An example technique for detecting when the computing device is in a closed position utilizes a first sensing portion 122 and a second sensing portion 124. The first sensing portion 122 is positioned on a region of the computing device 102, such as underneath an external surface near the edge of the computing device 102. Similarly, the second sensing portion 124 can be positioned underneath an external surface near an edge of the input device 104. Together, the first sensing portion 122 and the second sensing portion 124 form a sensing mechanism that can detect when the computing device 102 is in a closed position.

The sensing mechanism, for instance, can leverage the Hall effect to utilize magnetic force to detect proximity between the computing device 102 and the input device 104. For example, the first sensing portion 122 can include a Hall effect sensor and the second sensing portion 124 can include a magnet. When the computing device 102 is rotated to a closed position, the first sensing portion 122 can align with the second sensing portion 124 such that the Hall effect sensor in the first sensing portion 122 detects the magnet in the second sensing portion 124. The first sensing portion 122 can indicate to various functionalities that the computing device 102 is in a closed position, such as to the orientation module 112, the power state module 118, and so forth. When the computing device 102 is positioned away from the input device 104, the first sensing portion 122 does not detect the second sensing portion 124. Thus, the first sensing portion 122 can indicate to various functionalities that the computing device 102 is in an open position.

Figure 2:
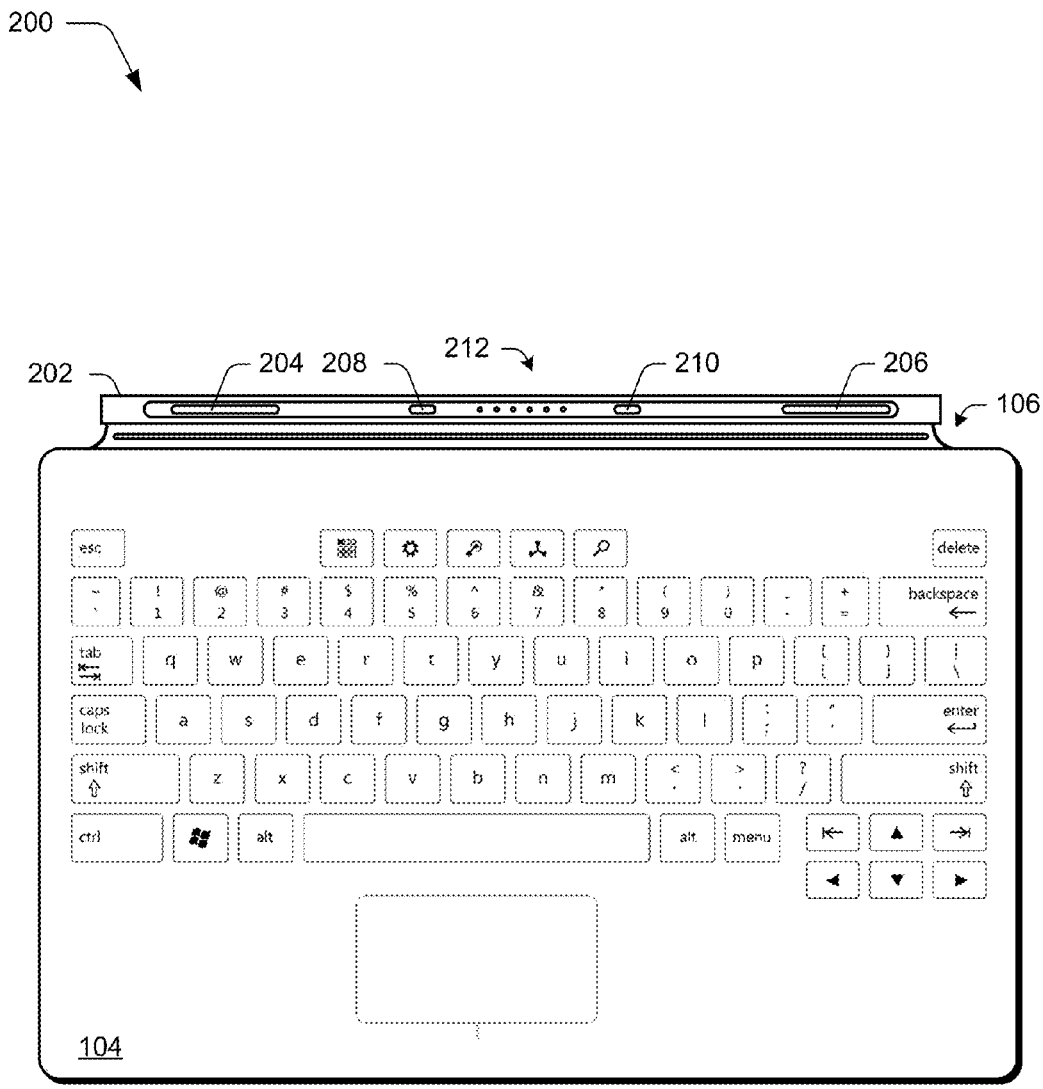
FIG. 2 depicts an example implementation of an input device of FIG. 1 as showing a flexible hinge in greater detail.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. The connection portion 202 as illustrated has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device the combination of the connection portion 202 and the flexible hinge 106 supports movement of the input device 104 in relation to the computing device 102 that is similar to a hinge of a book.

The connection portion 202 is illustrated in this example as including magnetic coupling devices 204, 206, mechanical coupling protrusions 208, 210, and communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connection portion 202 also includes mechanical coupling protrusions 208, 210 to form a mechanical physical connection between the input device 104 and the computing device 102. The communication contacts 212 are configured to contact corresponding communication contacts of the computing device 102 to form a communicative coupling between the devices as shown.

Having discussed an example environment in which embodiments may operate, consider now some example device orientations in accordance with one or more embodiments.

Example Device Orientations

The following discussion presents some example device orientations. As detailed, different device orientations can be associated with different device power states, different application states, and so forth.

Figure 3:
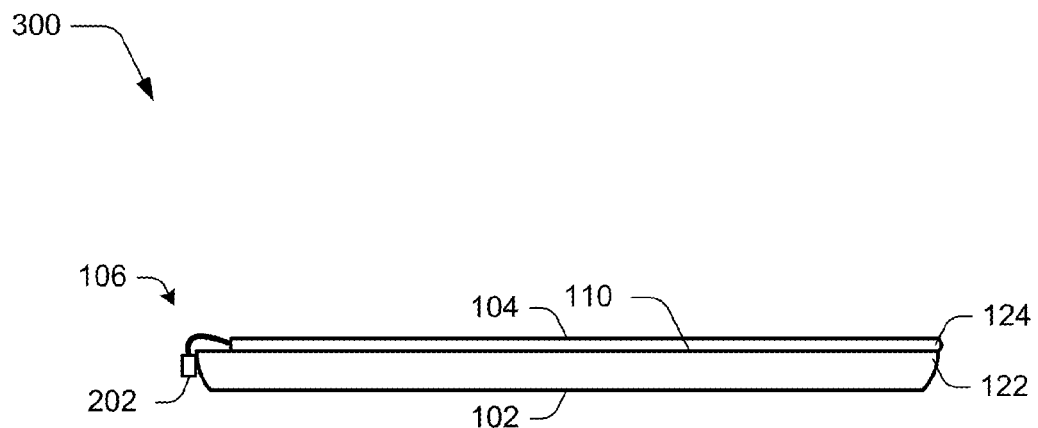
FIG. 3 depicts an example orientation of the input device in relation to the computing device in accordance with one or more embodiments.

FIG. 3 illustrates that the input device 104 may be rotated such that the input device 104 is placed against the display device 110 of the computing device 102 to assume an orientation 300. In the orientation 300, the input device 104 may act as a cover such that the input device 104 can protect the display device 110 from harm. In implementations, the orientation 300 can correspond to a closed position of the computing device 102.

As referenced above, in a closed position the first sensing portion 122 can detect the proximity of the second sensing portion 124. Thus, the first sensing portion 122 can indicate to various functionalities that the computing device 102 is in a closed position. For example, the power state module 118 can determine that the computing device 102 is in a closed position, and can cause the computing device 102 to transition to a closed power state. In the closed power state, various functionalities can be powered off and/or hibernated, such as the input device 104, the display device 110, and so on.

Figure 4:
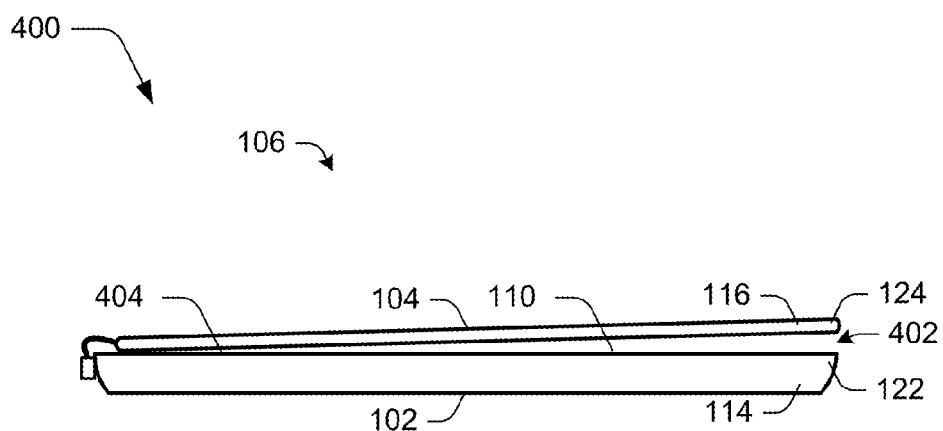
FIG. 4 depicts an example orientation of the input device in relation to the computing device in accordance with one or more embodiments.

FIG. 4 illustrates that the input device 104 has rotated away from the computing device 102 such that the computing device assumes an orientation 400. The orientation 400 includes a gap 402 that is introduced between the computing device 102 and the input device 104. In implementations, the orientation 400 can be caused unintentionally by a user, such as by inadvertent contact with the computing device 102 and/or the input device 104 that causes the computing device 102 to sag slightly away from the input device 104 such that the gap 402 is introduced.

In at least some embodiments, in the orientation 400 the first sensing portion 122 may not detect the proximity of the second sensing portion 124. For example, the distance between the first sensing portion 122 and the second sensing portion 124 introduced by the gap 402 may be such that the first sensing portion 122 does not detect the second sensing portion 124.

When the computing device 102 is oriented at an angle relative to the input device 104, such as in the orientation 400, techniques can determine the angle. For example, the computing device accelerometer 114 can determine an angle at which the computing device 102 is oriented relative to earth's surface. Further, the input device accelerometer 116 can determine an angle at which the input device 104 is oriented relative to earth's surface. As detailed below, these two angles can be compared to determine an angle of orientation of the computing device 102 relative to the input device 104.

In the example illustrated in FIG. 4, the computing device 102 is oriented at an angle 404 relative to the input device 104. For example, the angle 404 can be determined to be approximately 4 degrees. While in the orientation 400 the computing device 102 has rotated slightly to the angle 404, the computing device 102 may nonetheless be considered to be in a closed position for purposes of determining an appropriate power state. The angle 404, for instance, may be considered to be within an angle range that corresponds to a closed position for the computing device 102. For example, an angle range of 0 degrees-30 degrees can correspond to a closed position. As mentioned above, a closed position can correspond to a closed power state in which various functionalities can be powered off and/or hibernated.

Figure 5:
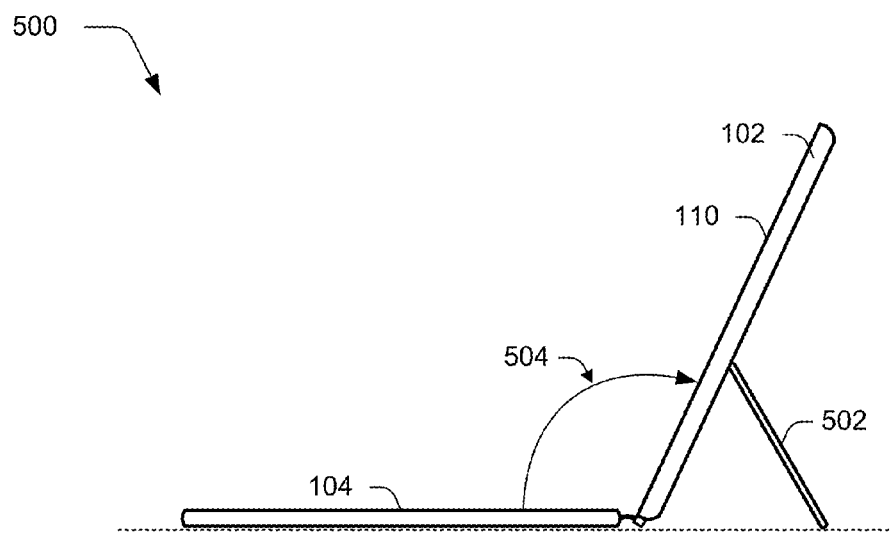
FIG. 5 depicts an example orientation of the input device in relation to the computing device in accordance with one or more embodiments.

FIG. 5 illustrates an example orientation 500 of the computing device 102. In the orientation 500, the input device 104 is laid flat against a surface and the computing device 102 is disposed at an angle to permit viewing of the display device 110, e.g., such as through use of a kickstand 502 disposed on a rear surface of the computing device 102. The orientation 500 can correspond to a typing arrangement whereby input can be received via the input device 104, such as using keys of the keyboard, the track pad 120, and so forth.

Further to the example illustrated in FIG. 5, the computing device 102 is oriented at an angle 504 relative to the input device 104. For example, the angle 504 can be determined to be approximately 115 degrees. The angle 504 may be considered to be within an angle range that corresponds to a typing position for the computing device 102. For example, an angle range of 31 degrees-180 degrees can correspond to a typing position. Within this angle range, the computing device 102 and/or the input device 104 can placed in a typing power state. In the typing power state, the input device 104 and the computing device 102 can be powered on, such that input can be provided to the computing device 102 via the input device 104.

Figure 6:
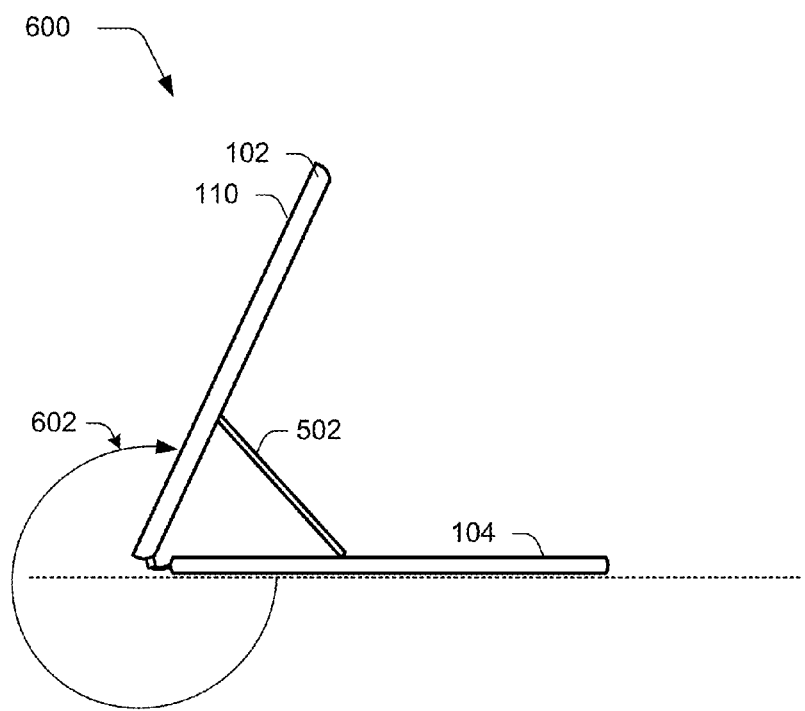
FIG. 6 depicts an example orientation of the input device in relation to the computing device in accordance with one or more embodiments.

FIG. 6 illustrates a further example orientation of the computing device 102, generally at 600. In the orientation 600, the computing device 102 is oriented such that the display device 110 faces away from the input device 104. In this example, the kickstand 502 can support the computing device 102, such as via contact with a back surface of the input device 104. Although not expressly illustrated here, a cover can be employed to cover and protect a front surface of the input device 104.

Further to the example illustrated in FIG. 6, the display device 110 of the computing device 102 is determined to be oriented at an angle 602 relative to the input device 104. For example, the angle 602 can be determined to be approximately 295 degrees. The angle 602 may be considered to be within an angle range that corresponds to a viewing position for the computing device 102. For example, an angle range of 200 degrees-360 degrees can correspond to a viewing position. The orientation 600 can enable easy access to and/or viewing of the display device 110, such as for viewing content, providing touch input to the computing device 102, and so forth.

Within this angle range, the computing device 102 and/or the input device 104 can placed in a viewing power state. In the viewing power state, the computing device 102 can be powered on, and the input device 104 can be powered off or hibernated. Thus, battery power that would be used to power the input device 104 can be conserved, while enabling interaction and/or viewing of the display device 110 of the computing device 102.

Figure 7:
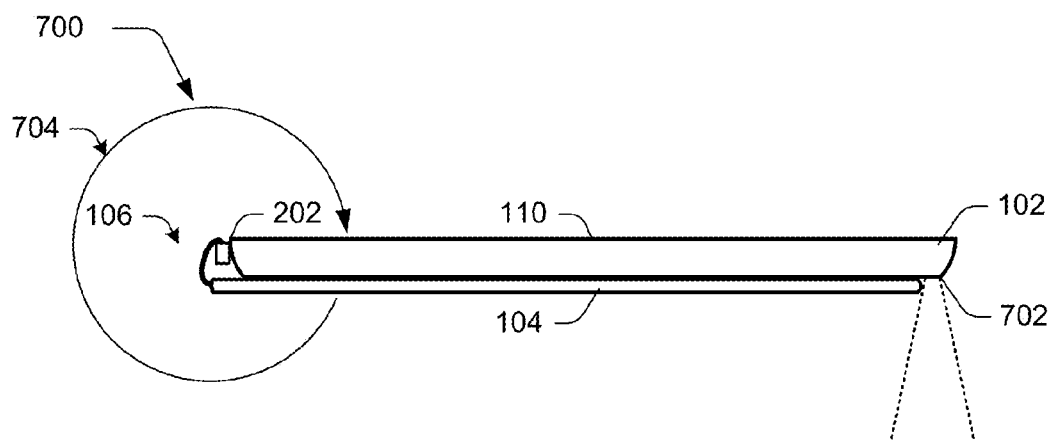
FIG. 7 depicts an example orientation of the input device in relation to the computing device in accordance with one or more embodiments.

FIG. 7 illustrates an example orientation 700, in which the input device 104 may also be rotated so as to be disposed against a back of the computing device 102, e.g., against a rear housing of the computing device 102 that is disposed opposite the display device 110 on the computing device 102. In this example, through orientation of the connection portion 202 to the computing device 102, the flexible hinge 106 is caused to "wrap around" the connection portion 202 to position the input device 104 at the rear of the computing device 102.

This wrapping causes a portion of a rear of the computing device 102 to remain exposed. This may be leveraged for a variety of functionality, such as to permit a camera 702 positioned on the rear of the computing device 102 to be used even though a significant portion of the rear of the computing device 102 is covered by the input device 104 in the example orientation 700.

Further to the example illustrated in FIG. 7, the display device 110 of the computing device 102 is determined to be oriented at an angle 704 relative to the input device 104. For example, the angle 704 can be determined to be approximately 360 degrees. The angle 704, for instance, may be considered to be within the angle range (referenced above) that corresponds to a viewing position such that the computing device 102 is in a viewing power state. As referenced above, a viewing power state can enable viewing of and/or interaction with the display device 110, while powering off or hibernating the input device 104. In the viewing power state, the camera 702 can be powered on such that photos can be captured while the computing device is in the viewing power state.

Figure 8:
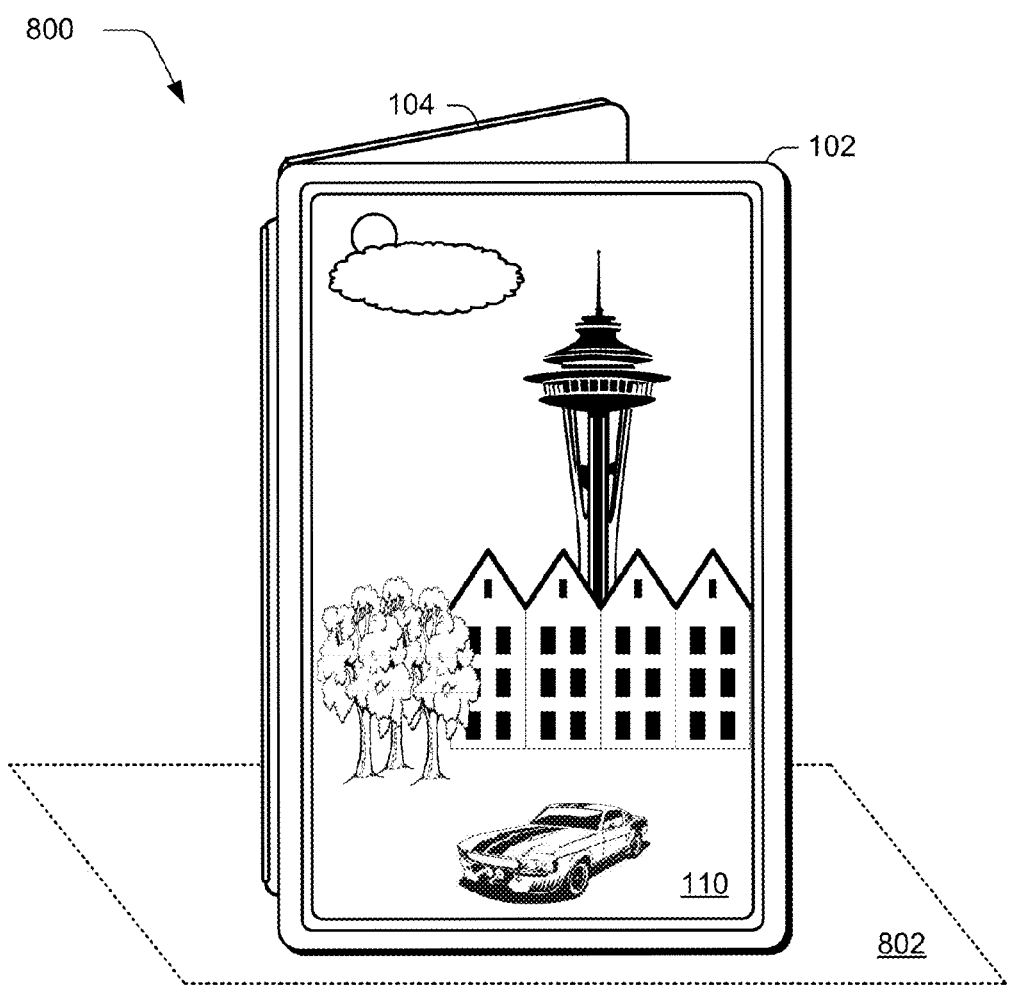
FIG. 8 depicts an example orientation of the input device in relation to the computing device in accordance with one or more embodiments.

FIG. 8 illustrates a further example orientation of the computing device 102, generally at 800. In the orientation 800, the computing device 102 is rotated sideways, e.g., in a portrait orientation relative to a surface 802 on which the computing device 102 is disposed. The display device 110 is visible, with the input device 104 rotated away from the display device 110. In at least some implementations, a width of the input device 104 can be narrower than a width of the computing device 102. Additionally or alternatively, the width of the input device 104 can be tapered such that the edge closest to the hinge 106 is wider than the outermost edge. This can enable the face of the display device 110 to recline back in the orientation 800, to provide for a suitable viewing angle.

Further to the example illustrated in FIG. 8, techniques discussed herein can determine that the computing device 102 is disposed in the orientation 800. For example, the computing device accelerometer 114 and/or the input device accelerometer 116 can determine that the computing device 102 and/or the input device 104 are rotated to the orientation 800. In the orientation 800, a screen orientation for the display device 110 can be rotated 90 degrees, e.g., to a portrait viewing mode. Further, the computing device 102 can be placed in a viewing power state. As referenced above, a viewing power state can enable viewing of and/or interaction with the display device 110, while powering off or hibernating the input device 104.

Figure 9:
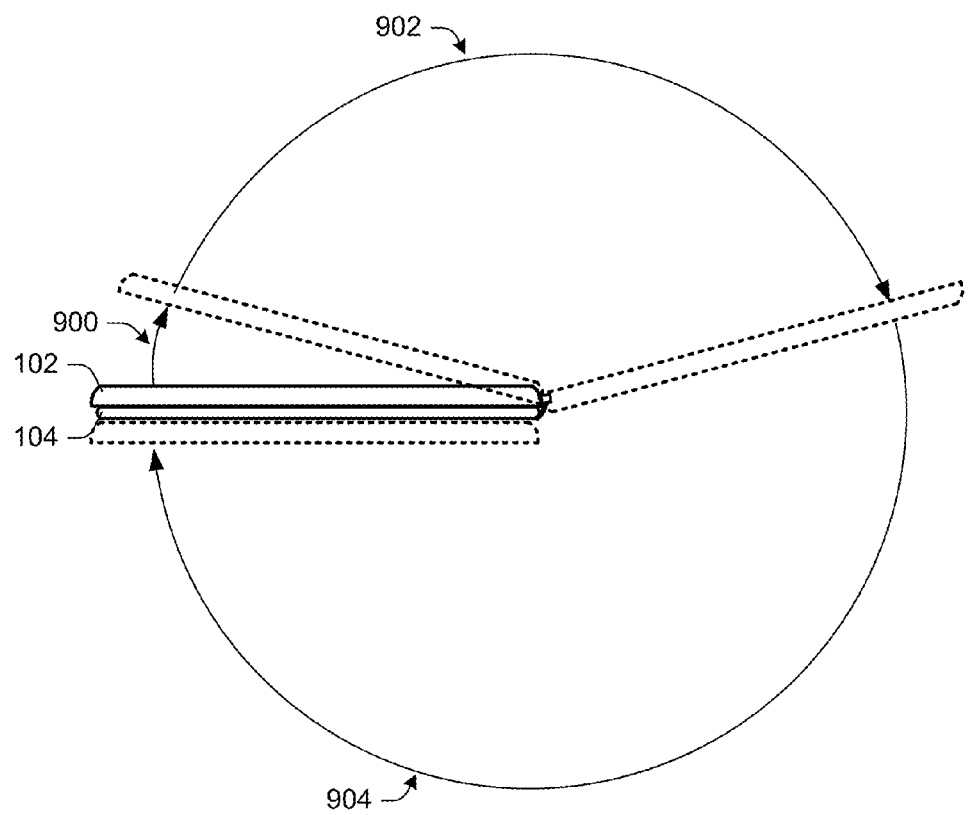
FIG. 9 depicts some example rotational orientations of the computing device in relation to the input device in accordance with one or more embodiments.

FIG. 9 illustrates that the computing device 102 may be rotated within a variety of different angle ranges with respect to the input device 104. As detailed herein, different angle ranges can be associated with different power states, different application states, and so on.

An angle range 900 is illustrated, which corresponds to a closed position for the computing device 102. Thus, if the computing device 102 is positioned at an angle within the angle range 900 relative to the input device 104, the computing device 102 can be determined to be in a closed position. As referenced above, a closed position can include an associated closed power state where various functionalities can be powered off and/or hibernated, such as the input device 104, the display device 110, and so on.

Further illustrated is an angle range 902, which corresponds to a typing orientation for the computing device 102. Thus, if the computing device 102 is positioned at an angle within the angle range 902 relative to the input device 104, the computing device 102 can be determined to be in a typing orientation. Within this orientation, the computing device 102 and/or the input device 104 can placed in a typing power state where the input device 104 and the computing device 102 can be powered on, such that input can be provided to the computing device 102 via the input device 104, touch input to the display device 100, and so forth.

FIG. 9 further illustrates an angle range 904, which corresponds to a viewing position for the computing device 102. Thus, if the computing device 102 is positioned at an angle within the angle range 904 relative to the input device 104, the computing device 102 can be determined to be in a viewing orientation. In this orientation, the computing device 102 and/or the input device 104 can placed in a viewing power state such that the computing device 102 can be powered on, and the input device 104 can be powered off or hibernated.

The orientations, angle ranges, power states, and so forth discussed above are presented for purposes of illustration only. It is contemplated that a wide variety of different orientations, power states, and angle ranges may be implemented within the spirit and scope of the claimed embodiments.

Having discussed some example device orientations, consider now some example procedures in accordance with one or more embodiments.

Example Procedures

Figure 10:
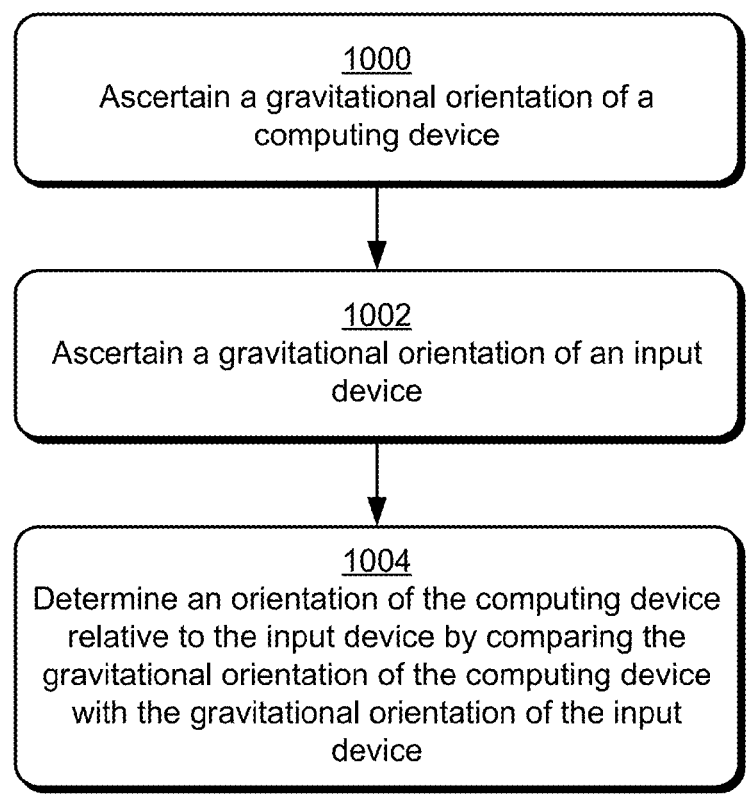
FIG. 10 is a flow diagram that describes steps in a method in accordance with one or more embodiments.

FIG. 10 is a flow diagram that describes steps in a method in accordance with one or more embodiments. In at least some embodiments, the method can be employed to determine an orientation of a computing device with respect to an input device.

Step 1000 ascertains a gravitational orientation of a computing device. For example, an orientation of the computing device accelerometer 114 relative to earth's gravity (e.g., the gravitational vector) can be determined. In implementations, this can include determining an angle at which an axis of the computing device accelerometer 114 is oriented with reference to earth's gravity.

Step 1002 ascertains a gravitational orientation of an input device. For example, an orientation of the input device accelerometer 116 relative to earth's gravity can be determined. In implementations, this can include determining an angle at which an axis of the input device accelerometer 116 is oriented with reference to earth's gravity.

Step 1004 determines an orientation of the computing device relative to the input device by comparing the gravitational orientation of the computing device with the gravitational orientation of the input device. For example, an angle at which the computing device is oriented relative to gravity can be compared to angle at which the input device is oriented relative to gravity, to determine an angle at which the computing device is oriented relative to the input device.

One example way of determining the orientation is as an angle Θ (theta) between the computing device and the input device. Θ can be determined using the equation $$\Theta = \cos^{-1} \frac{A \cdot B}{|A||B|},$$

or the dot product divided by the product of the magnitudes, where A is the gravity vector of the computing device, and B is the gravity vector of the input device. This equation is presented for purpose of example only, and a wide variety of techniques can be employed to determine the orientation of the computing device relative to the input device within the spirit and scope of the claimed embodiments.

While techniques are discussed herein with respect to determining relative orientations using accelerometers, a variety of different techniques may be employed to determine orientations within the spirit and scope of the claimed embodiments.

Figure 11:
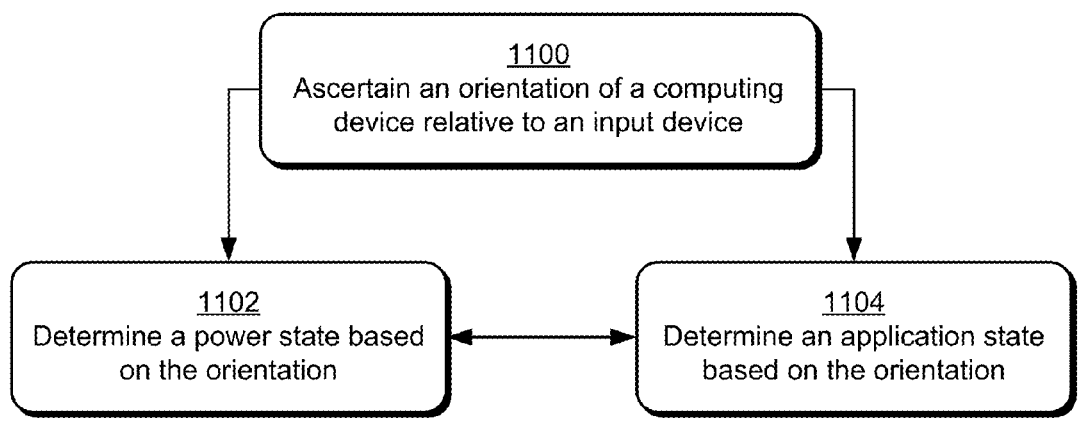
FIG. 11 is a flow diagram that describes steps in a method in accordance with one or more embodiments.

FIG. 11 is a flow diagram that describes steps in a method in accordance with one or more embodiments. Step 1100 ascertains an orientation of a computing device relative to an input device. As discussed above, an orientation can include an angle at which a computing device is oriented with reference to an input device, and vice-versa.

Step 1102 determines a power state based on the orientation. For example, the power state can be determined for the computing device, the input device, and/or other devices that are operably associated with the computing device. Examples of different power states are discussed above.

Step 1104 determines an application state based on the orientation. For example, a particular functionality of an application can be enabled or disabled based on a particular orientation. In implementations, steps 1102 and 1104 can occur together, sequentially, alternatively, and so on.

The application state can be determined from a group of applications states that can be applied to the application while the application is running on the computing device. Thus, the application can include different operational states, at least some of which depend on device orientation. For example, consider a scenario including an application that enables a user to play a digital piano via a computing device. An input device that is operably attached to the computing device can include keys that can be pressed to play different musical notes of a piano. Thus, when the input device is disposed in an orientation in which input may be provided via the input device (e.g., the orientation 500 discussed above with reference to FIG. 5), the application can enable functionality to receive input from the input device to play musical notes.

When the input device is disposed in a different orientation, however, the application can disable functionality for receiving input from the input device. For instance, in the orientation 700 discussed above, the input device 104 is powered off or hibernated. Thus, in this orientation, the example application can disable functionality for receiving input via the input device 104. Further, the application can enable other functionality for receiving input, such as presenting visual piano keys that can be displayed via the display device 110 and that can receive touch input from a user for playing the digital piano.

As another example, the input device can be configured as a game controller. Thus, a game application can enable and disable particular game-related functionalities based on an orientation of the computing device and/or the input device.

Touch Initiated Power State Transition

In at least some implementations, techniques enable transitions between power states in response to detected touch interactions. For example, vibrations that result from touch interaction can be detected to trigger certain events.

Figure 12:
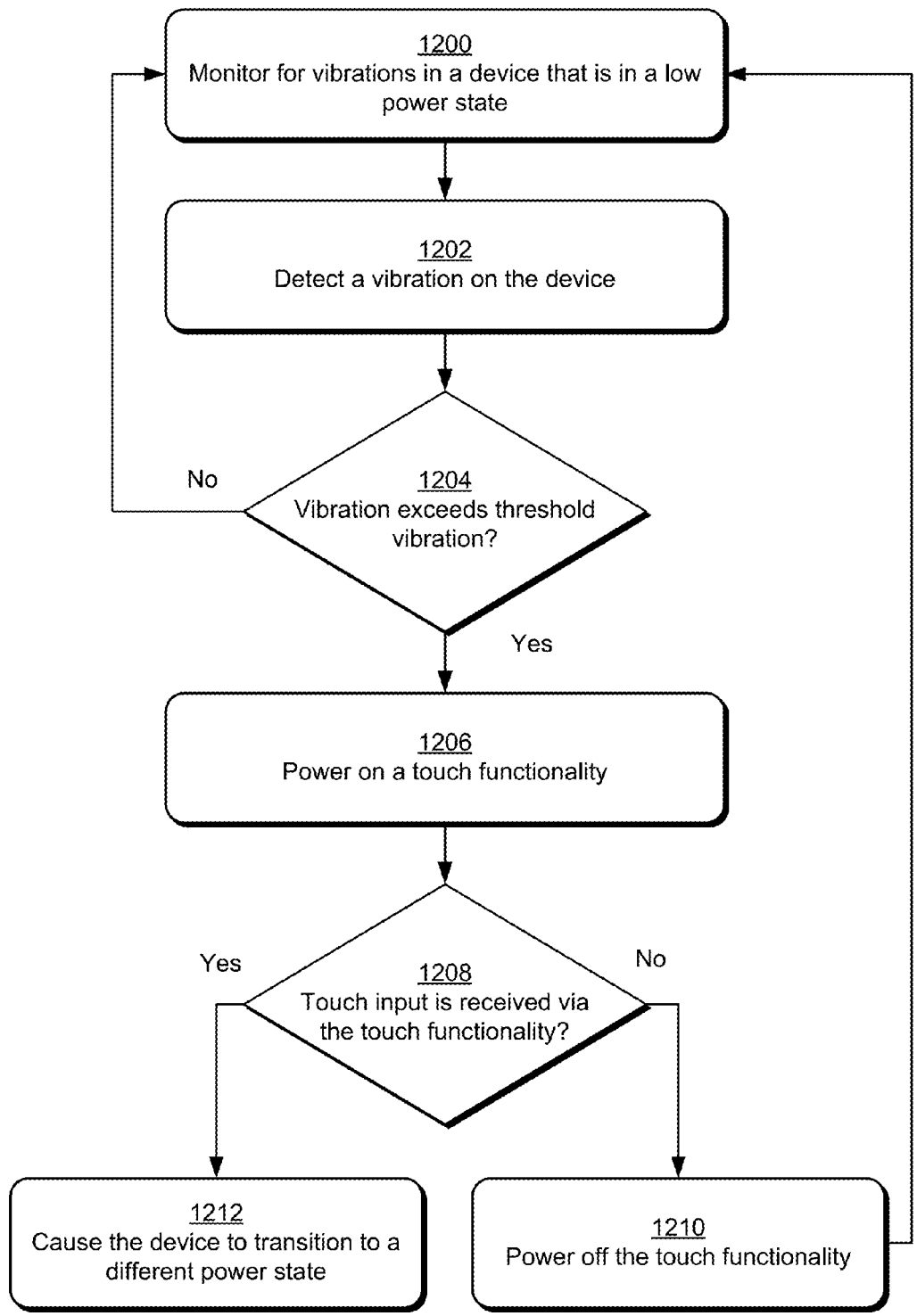
FIG. 12 is a flow diagram that describes steps in a method in accordance with one or more embodiments.

FIG. 12 is a flow diagram that describes steps in a method in accordance with one or more embodiments. Step 1200 monitors for vibrations in a device that is in a low power state. The monitoring, for instance, can occur in a low power state for the computing device 102 (e.g., a sleep mode) in which various functionalities are powered off and/or hibernated, such as the keyboard and track pad 120 of the input device 104, processors and/or the display device 110 of the computing device 102, and so forth. In the low power state, the computing device accelerometer 114 and/or the input device accelerometer 116 can be powered on to detect vibrations.

Step 1202 detects a vibration on the device. For example, the computing device accelerometer 114 and/or the input device accelerometer 116 can detect a vibration. As referenced above, a variety of different events can cause a device vibration. For instance, a user can provide touch input to a touch functionality to cause the device to wake from a low power mode. Alternatively, a vibration can be caused by other forms of contact with a device, such as a user bumping the device, a user bumping a surface on which the device is situated, and so on.

Step 1204 ascertains whether the vibration exceeds a vibration threshold. For example, a vibration threshold can be specified in terms of a suitable measurement, such as in meters per second squared ("g"), hertz ("Hz"), and so on. A vibration may be detected, for instance, as N number of zero-crossings and N+1 values greater than a threshold of the readings from an accelerometer within a certain amount of time T. For example, if the readings from the accelerometer are +1 g, then −1 g, and then +1 g within 5 ms, this may be considered a single bump or vibration event. These are examples only, and any specific value may be used according to the specific implementation.

If the vibration does not exceed the vibration threshold ("No"), the method returns to step 1200. If the vibration exceeds the vibration threshold ("Yes"), step 1206 powers on a touch functionality. A touch functionality, for instance, includes a functionality that is configured to receive touch input. Examples of a touch functionality include a track pad (e.g., the track pad 120), a touch screen (e.g., the display device 110), a capacitive touch device, a keyboard for the input device 104, and so on. In at least some implementations, an accelerometer that detects the vibration can notify a device processor, which can cause power to be supplied to the touch functionality. For example, prior to the vibration being detected, the touch functionality can be in a power off mode, such as a hibernation mode. Thus, in response to detecting the vibration, the touch functionality can be powered on.

Step 1208 determines whether touch input is received via the touch functionality. For example, the touch functionality can be queried to determine whether touch input is received. If touch input is not received ("No"), step 1210 powers off the touch functionality. For instance, if the touch functionality indicates that touch input is not received, the touch functionality can be powered off. As referenced above, a vibration can result from other forms of contact with a device besides touch input to an input functionality, such as a user accidentally bumping the device. In at least some implementations, the method can return to step 1200.

If touch input is received ("Yes"), step 1212 causes the device to transition to a different power state. For example, the device can transition from the low power state to a powered state. Examples of a powered state include the typing and viewing power states discussed above. Thus, the different power state can cause various functionalities to be powered on, such as processors of the computing device 102, the display device 110, the input device 104, and so on.

Thus, the method described in FIG. 12 can enable a touch functionality that consumes more power (e.g., a capacitive sensing functionality) to remain in a low power mode, while a functionality that consumes relatively less power can remain powered on to detect vibrations associated with a possible touch interaction. If a vibration is detected, the touch functionality can be powered on to determine whether the vibration was caused by touch input to the touch functionality, e.g., by a user that wishes to wake a device from a low power mode. Thus, a lower power functionality (e.g., an accelerometer) can be employed as a monitoring mechanism, and a functionality that consumes more power (e.g., a touch functionality) can be employed as a confirmation mechanism to determine whether a detected vibration is a result of touch input, or some other event.

Example System and Device

Figure 13:
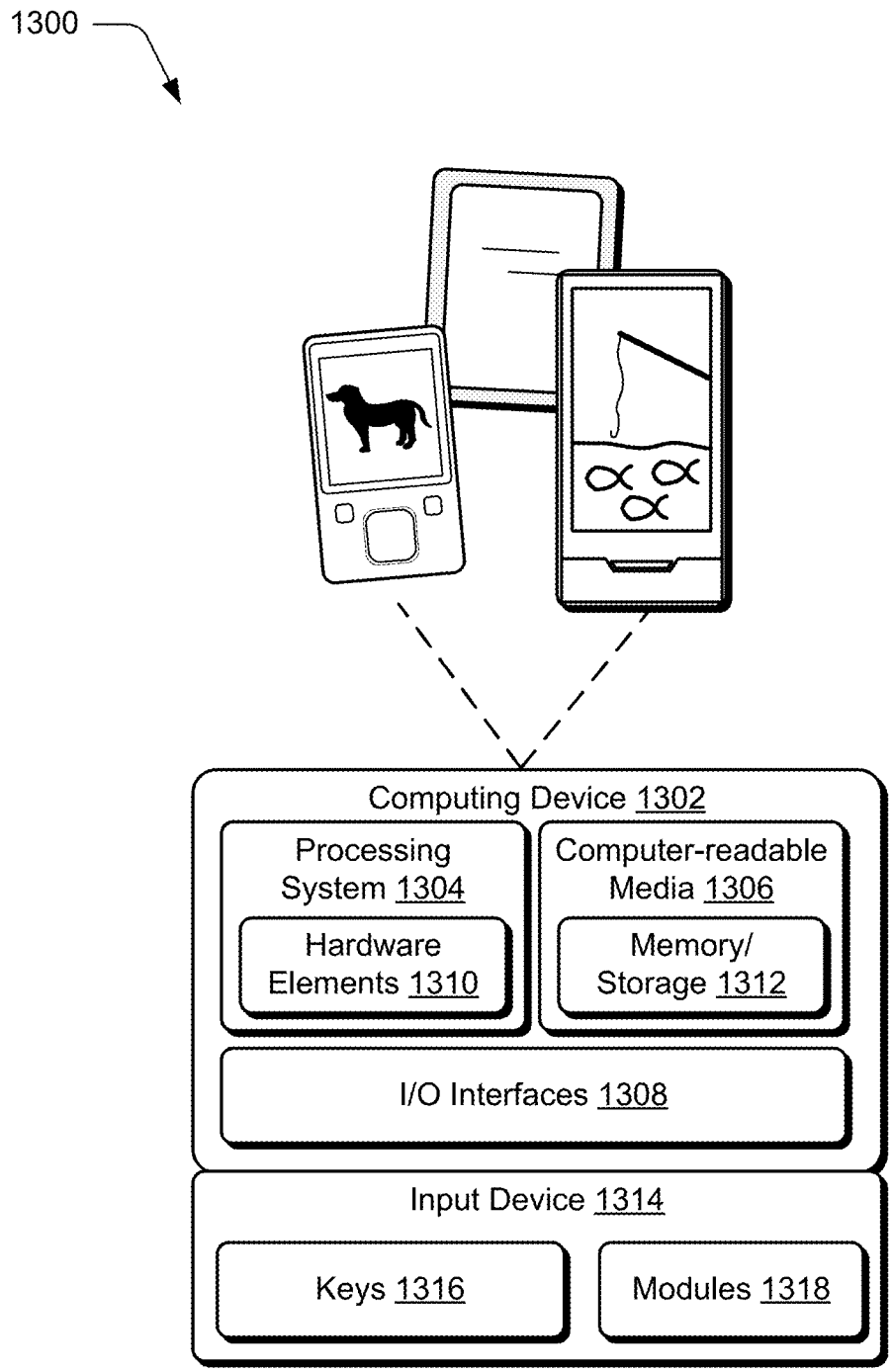
FIG. 13 illustrates an example system including various components of an example device that can be implemented as any type of computing device as described with reference to FIGS. 1-12 to implement embodiments of the techniques described herein.

FIG. 13 illustrates an example system generally at 1300 that includes an example computing device 1302 that is representative of one or more computing systems and/or devices that may implement the various techniques described herein. The computing device 1302 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1302 as illustrated includes a processing system 1304, one or more computer-readable media 1306, and one or more I/O interface 1308 that are communicatively coupled, one to another. Although not shown, the computing device 1302 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1304 is representative of functionality to perform one or more operations using hardware. Accordingly, the processing system 1304 is illustrated as including hardware element 1310 that may be configured as processors, functional blocks, and so forth. This may include implementation in hardware as an application specific integrated circuit or other logic device formed using one or more semiconductors. The hardware elements 1310 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1306 is illustrated as including memory/storage 1312. The memory/storage 1312 represents memory/storage capacity associated with one or more computer-readable media. The memory/storage component 1312 may include volatile media (such as random access memory (RAM)) and/or nonvolatile media (such as read only memory (ROM), Flash memory, optical disks, magnetic disks, and so forth). The memory/storage component 1312 may include fixed media (e.g., RAM, ROM, a fixed hard drive, and so on) as well as removable media (e.g., Flash memory, a removable hard drive, an optical disc, and so forth). The computer-readable media 1306 may be configured in a variety of other ways as further described below.

Input/output interface(s) 1308 are representative of functionality to allow a user to enter commands and information to computing device 1302, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1302 may be configured in a variety of ways to support user interaction.

The computing device 1302 is further illustrated as being communicatively and physically coupled to an input device 1314 that is physically and communicatively removable from the computing device 1302. In this way, a variety of different input devices may be coupled to the computing device 1302 having a wide variety of configurations to support a wide variety of functionality. In this example, the input device 1314 includes one or more keys 1316, which may be configured as pressure sensitive keys, mechanically switched keys, and so forth.

The input device 1314 is further illustrated as include one or more modules 1318 that may be configured to support a variety of functionality. The one or more modules 1318, for instance, may be configured to process analog and/or digital signals received from the keys 1316 to determine whether a keystroke was intended, determine whether an input is indicative of resting pressure, support authentication of the input device 1314 for operation with the computing device 1302, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

Techniques may further be implemented in a network environment, such as utilizing various cloud-based resources. For instance, methods, procedures, and so forth discussed above may leverage network resources to enable various functionalities.

An implementation of the described modules and techniques may be stored on or transmitted across some form of computer-readable media. The computer-readable media may include a variety of media that may be accessed by the computing device 1302. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1302, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1310 and computer-readable media 1306 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1310. The computing device 1302 may be configured to implement particular instructions and/or functions corresponding to the software and/or hardware modules. Accordingly, implementation of a module that is executable by the computing device 1302 as software may be achieved at least partially in hardware, e.g., through use of computer-readable storage media and/or hardware elements 1310 of the processing system 1304. The instructions and/or functions may be executable/operable by one or more articles of manufacture (for example, one or more computing devices 1302 and/or processing systems 1304) to implement techniques, modules, and examples described herein.

Discussed herein are a number of methods that may be implemented to perform techniques discussed herein. Aspects of the methods may be implemented in hardware, firmware, or software, or a combination thereof. The methods are shown as a set of blocks that specify operations performed by one or more devices and are not necessarily limited to the orders shown for performing the operations by the respective blocks. Further, an operation shown with respect to a particular method may be combined and/or interchanged with an operation of a different method in accordance with one or more implementations. Aspects of the methods can be implemented via interaction between various entities discussed above with reference to the environment 100.

Conclusion

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A computer-implemented method comprising:
   monitoring for vibrations via a vibration sensing functionality in a device that is in a low power state;
   responsive to detecting a vibration, ascertaining, via a computing device, whether the vibration exceeds a vibration threshold;
   in an event that the vibration exceeds the vibration threshold:
      powering on a touch-sensing functionality of the device while maintaining the device in the low power state, the touch-sensing functionality being different than the vibration sensing functionality and having a power state that is controllable independent of a power state of the device;
      determining, while maintaining the device in the low power state, whether touch input is received via the touch-sensing functionality; and
      in an event that touch input is received via the touch-sensing functionality, causing the device to transition from the low power state to a different power state.

2. A method as recited in claim 1, wherein the device comprises a computing device, or an input device communicatively associated with the computing device.

3. A method as recited in claim 1, wherein the device comprises a computing device, and wherein said monitoring employs one or more accelerometers positioned on at least one of the computing device or an input device communicatively coupled to the computing device.

4. A method as recited in claim 1, where the touch-sensing functionality comprises at least one of a track pad or a touch screen of the device.

5. A method as recited in claim 1, wherein the low power state comprises a state in which one or more functionalities of the device are powered off, and wherein the different power state comprises a state in which the one or more functionalities are powered on.

6. A method as recited in claim 1, further comprising, in an event that touch input is not received via the touch-sensing functionality:
   powering off the touch-sensing functionality; and
   continuing to monitor for vibrations in the device in the low power state.

7. A method as recited in claim 1, wherein the touch-sensing functionality comprises a capacitive touch sensing device.

8. A system comprising:
   one or more processors; and
   one or more computer-readable storage memory storing instructions that are executable by the one or more processors to perform operations including:
   monitoring for vibrations via a vibration sensing functionality in a device that is in a low power state;
   responsive to detecting a vibration, ascertaining, via a computing device, whether the vibration exceeds a vibration threshold;
   in an event that the vibration exceeds the vibration threshold:
   powering on a touch-sensing functionality of the device while maintaining the device in the low power state, the touch-sensing functionality being different than the vibration sensing functionality and having a power state that is controllable independent of a power state of the device;

determining, while maintaining the device in the low power state, whether touch input is received via the touch-sensing functionality; and in an event that touch input is received via the touch-sensing functionality, causing the device to transition from the low power state to a different power state.

9. A system as recited in claim 8, wherein the device comprises a computing device, or an input device communicatively associated with the computing device.

10. A system as recited in claim 8, wherein the device comprises a computing device, and wherein said monitoring employs one or more accelerometers positioned on at least one of the computing device or an input device communicatively coupled to the computing device.

11. A system as recited in claim 8, where the touch-sensing functionality comprises at least one of a track pad or a touch screen of the device.

12. A system as recited in claim 8, wherein the touch-sensing functionality comprises a capacitive touch sensing device.

13. A system as recited in claim 8, wherein the low power state comprises a state in which one or more functionalities of the device are powered off, and wherein the different power state comprises a state in which the one or more functionalities are powered on.

14. A system as recited in claim 8, wherein the operations further include, in an event that touch input is not received via the touch-sensing functionality:

powering off the touch-sensing functionality; and
continuing to monitor for vibrations in the device in the low power state.

15. One or more computer-readable storage memories storing instructions that are executable by one or more processors to perform operations comprising:

monitoring for vibrations via a vibration sensing functionality in a device that is in a low power state;
responsive to detecting a vibration, ascertaining, via a computing device, whether the vibration exceeds a vibration threshold;
in an event that the vibration exceeds the vibration threshold:
powering on a touch-sensing functionality of the device while maintaining the device in the low power state, the touch-sensing functionality being different than the vibration sensing functionality and having a power state that is controllable independent of a power state of the device;
determining, while maintaining the device in the low power state, whether touch input is received via the touch-sensing functionality; and
in an event that touch input is received via the touch-sensing functionality, causing the device to transition from the low power state to a different power state.

16. One or more computer-readable storage memories as recited in claim 15, wherein the device comprises a computing device, or an input device communicatively associated with the computing device.

17. One or more computer-readable storage memories as recited in claim 15, wherein the device comprises a computing device, and wherein said monitoring employs one or more accelerometers positioned on at least one of the computing device or an input device communicatively coupled to the computing device.

18. One or more computer-readable storage memories as recited in claim 15, where the touch-sensing functionality comprises at least one of a track pad or a touch screen of the device.

19. One or more computer-readable storage memories as recited in claim 15, wherein the low power state comprises a state in which one or more functionalities of the device are powered off, and wherein the different power state comprises a state in which the one or more functionalities are powered on.

20. One or more computer-readable storage memories as recited in claim 15, wherein the operations further include, in an event that touch input is not received via the touch-sensing functionality:

powering off the touch-sensing functionality; and
continuing to monitor for vibrations in the device in the low power state.

* * * * *